US011728961B2

(12) United States Patent
Lee et al.

(10) Patent No.: US 11,728,961 B2
(45) Date of Patent: Aug. 15, 2023

(54) CLOCK GENERATING CIRCUIT AND WIRELESS COMMUNICATION DEVICE INCLUDING THE SAME

(71) Applicant: SAMSUNG ELECTRONICS CO., LTD., Suwon-si (KR)

(72) Inventors: Kyung Min Lee, Yongin-si (KR); Jae Hong Jung, Bucheon-si (KR); Seung Jin Kim, Yongin-si (KR); Seung Hyun Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/586,182

(22) Filed: Jan. 27, 2022

(65) Prior Publication Data

US 2022/0368513 A1 Nov. 17, 2022

(30) Foreign Application Priority Data

May 13, 2021 (KR) .......................... 10-2021-0062075

(51) Int. Cl.
*H04L 7/00* (2006.01)
*H04L 7/033* (2006.01)

(52) U.S. Cl.
CPC ............ *H04L 7/0037* (2013.01); *H04L 7/033* (2013.01)

(58) Field of Classification Search
CPC ......................... H03K 5/00006; H04L 7/0037

USPC .......................................................... 375/362
See application file for complete search history.

(56) References Cited

U.S. PATENT DOCUMENTS

| | | | |
|---|---|---|---|
| 6,741,108 B1 | 5/2004 | Balardeta et al. | |
| 7,579,884 B2 | 8/2009 | Masson | |
| 8,514,003 B2 | 8/2013 | Hong | |
| 8,988,121 B2 * | 3/2015 | Terrovitis | H03L 7/23 |
| | | | 327/158 |
| 9,490,784 B2 | 11/2016 | Vahid Far et al. | |
| 10,003,328 B1 * | 6/2018 | Yin | H03K 7/08 |
| 10,224,936 B1 | 3/2019 | Lin | |
| 2019/0386649 A1 * | 12/2019 | Chen | G06F 1/04 |

* cited by examiner

*Primary Examiner* — Leila Malek
(74) *Attorney, Agent, or Firm* — F. Chau & Associates, LLC

(57) ABSTRACT

A clock generating circuit includes a first frequency multiplier configured to generate a second clock signal having a second frequency based on a first clock signal having a first frequency, and a second frequency multiplier configured to generate a third clock signal having a third frequency based on the second clock signal. The first frequency multiplier includes a circuit configured to control a duty cycle of the first clock signal, a delay circuit configured to receive the duty controlled clock signal, and delay the received signal based on a duty cycle of the second clock signal to output a first delay clock signal, and an XOR gate configured to perform an XOR computation using the duty controlled clock signal and the first delay clock signal to output the second clock signal. The second frequency is greater than the first frequency, and the third frequency is greater than the second frequency.

19 Claims, 24 Drawing Sheets

CLOCK GENERATING CIRCUIT AND WIRELESS COMMUNICATION DEVICE INCLUDING THE SAME

CROSS-REFERENCE TO RELATED APPLICATION

This U.S. non-provisional application claims priority under 35 U.S.C. § 119 to Korean Patent Application No. 10-2021-0062075 filed on May 13, 2021 in the Korean Intellectual Property Office, the disclosure of which is incorporated by reference in its entirety herein.

TECHNICAL FIELD

The present disclosure relates to a clock generating circuit and a wireless communication device including the same.

DISCUSSION OF RELATED ART

Generally, a semiconductor integrated circuit (IC) may operate by being synchronized with a clock signal. The clock signal may be input from the outside of the semiconductor integrated circuit, or may be generated through a clock generator included in the semiconductor integrated circuit. The semiconductor integrated circuit may not be able to perform all of its operations using only one clock signal having the same period. A clock generating circuit may be used to generate clock signals having a different periods from an input clock signal and a reference clock signal.

For example, the clock generating circuit may include a phase locked loop circuit to generate the reference clock signal. In this case, when a frequency of an input clock signal input to the clock generating circuit is low, noise of the generated reference clock signal may be increased. That is, when the frequency of the input clock signal input to the clock generating circuit is increased, noise of the generated reference clock signal may be reduced. However, the circuit for increasing the frequency of the input clock signal may occupy a large area and consume much power.

SUMMARY

At least one embodiment of the present disclosure provides a clock generating circuit that reduces power consumption and reduces noise of a clock signal.

At least one embodiment of the present disclosure provides a wireless communication device that reduces power consumption and reduces noise of a clock signal.

The aspects of the present disclosure are not limited to those mentioned above, and additional objects of the present disclosure, which are not mentioned herein, will be clearly understood by those skilled in the art from the following description of the present disclosure.

According to an embodiment of the present disclosure, a clock generating circuit includes a first frequency multiplier and a second frequency multiplier. The first frequency multiplier is configured to generate a second clock signal having a second frequency based on a first clock signal having a first frequency, and a second frequency multiplier configured to generate a third clock signal having a third frequency based on the second clock signal. The first frequency multiplier includes a pulse width control circuit configured to control a duty cycle of the first clock signal, a first delay circuit configured to receive the first clock signal of which the duty cycle has been controlled, and delay the received first clock signal based on a duty cycle of the second clock signal to output a first delay clock signal, and a first exclusive OR gate configured to perform an exclusive OR computation on the first clock signal, of which the duty cycle has been controlled and the first delay clock signal to output the second clock signal. The second frequency is greater than the first frequency, and the third frequency is greater than the second frequency.

According to an embodiment of the present disclosure, a clock generating circuit includes a pulse width control circuit, a first delay circuit, a first exclusive OR gate, a second delay circuit, and a second exclusive OR gate. The pulse width control circuit is configured to control a duty cycle of an input clock signal having a first frequency to output a first clock signal. The first delay circuit is configured to delay the first clock signal to output a first delay clock signal. The first exclusive OR gate is configured to perform an exclusive OR computation on the first clock signal and the first delay clock signal to output a second clock signal having a second frequency. The second delay circuit is connected with the first exclusive OR gate, and configured to delay the second clock signal to output a second delay clock signal. The second exclusive OR gate is connected with the first exclusive OR gate, and configured to perform an exclusive OR computation on the second clock signal and the second delay clock signal to output a third clock signal having a third frequency. The second frequency is greater than the first frequency, and the third frequency is greater than the second frequency.

According to an embodiment of the present disclosure, a clock generating circuit includes a first frequency multiplier, a second frequency multiplier, and a delay control circuit. The first frequency multiplier is configured to receive a first clock signal having a first frequency and delay the first clock signal to output a second clock signal having a second frequency. The second frequency multiplier is configured to receive the second clock signal and output a third clock signal having a third frequency. The delay control circuit is configured to determine a delay amount for the first clock signal of the first frequency multiplier based on a duty cycle of the second clock signal to allow the duty cycle of the second clock signal to reach 50%. The second frequency is greater than the first frequency, and the third frequency is greater than the second frequency.

According to an embodiment of the present disclosure, a wireless communication device includes a clock generating circuit, a signal processor, a transmission circuit, and a reception circuit. The clock generating circuit is configured to receive a first clock signal to generate an output clock signal. The signal processor is configured to control the clock generating circuit. The transmission circuit is configured to process a transmission signal from the signal processor based on the output clock signal. The reception circuit is configured to process an external reception signal based on the output clock signal to transfer the processed signal to the signal processor. The clock generating circuit includes a frequency multiplier configured to convert a first clock signal having a first frequency into a third clock signal having a third frequency, and a phase locked loop circuit configured to generate an output clock signal by fixing the third clock signal. The frequency multiplier delays the first clock signal to generate a second clock signal having a second frequency, delays the second clock signal to generate the third clock signal, and controls a delay amount of the first clock signal to allow a duty cycle of the second clock signal to reach 50%. The second frequency is twice the first frequency, and the third frequency is twice the second frequency.

BRIEF DESCRIPTION OF THE DRAWINGS

Features of the present disclosure will become more apparent by describing in detail embodiments thereof with reference to the attached drawings, in which.

DETAILED DESCRIPTION OF EXEMPLARY EMBODIMENTS

Hereinafter, the embodiments of the present disclosure will be described with reference to the accompanying drawings.

Hereinafter, a clock generating circuit 10 will be described with reference to FIGS. 1 to 3.

Figure 1:
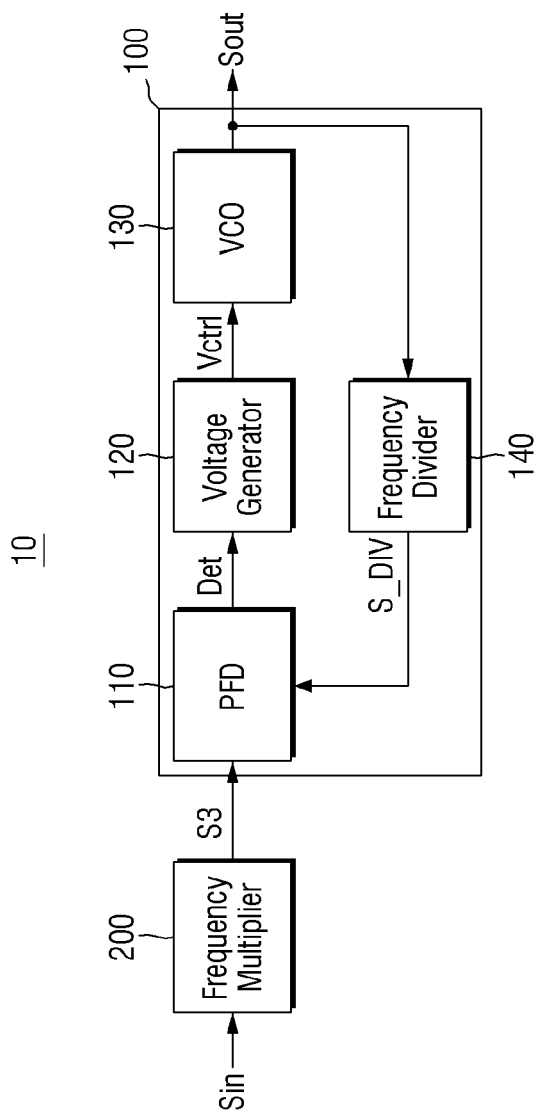
FIG. 1 is a block diagram illustrating a clock generating circuit according to an embodiment of the disclosure.

FIG. 1 is a block diagram illustrating a clock generating circuit according to an embodiment of the disclosure. FIG. 2 is a block diagram illustrating a frequency multiplier of FIG. 1. FIG. 3 is a diagram illustrating the frequency multiplier of FIG. 2.

Referring to FIG. 1, the clock generating circuit 10 may include a clock generator 100 and a frequency multiplier 200. The frequency multiplier 200 (e.g., a multiplier circuit) may be connected to the clock generator 100.

The clock generator 100 may receive a third clock signal S3 from the frequency multiplier 200, and may generate an output clock signal Sout having a specific frequency based on the third clock signal S3. For example, the clock generator 100 may include a phase locked loop (PLL), but the embodiment of the present disclosure is not limited thereto. Also, in some embodiments, the clock generator 100 may be implemented as one integrated circuit manufactured by a semiconductor process, and may include at least one semiconductor package including an integrated circuit, and a board on which the semiconductor package is packaged.

The clock generator 100 may include a phase frequency detector 110, a voltage generator 120, a voltage controlled oscillator (VCO) 130, and a frequency divider 140 (e.g., a divider circuit). The phase frequency detector 110 may be replaced with a phase detector. The voltage controlled oscillator 130 may be implemented as a ring VCO. The input clock signal Sin may be vibrated at a certain frequency. For example, a crystal oscillator may generate the input clock signal Sin and provide the generated input clock signal Sin to the frequency multiplier 200. Also, the output clock signal Sout may have a frequency required by a circuit, that is, a target frequency. That is, the clock generating circuit 10 may generate an output clock signal Sout having a jitter property required by the clock generating circuit 10.

The phase frequency detector 110 may receive a third clock signal S3 provided from the frequency multiplier 200, and may receive a divided clock signal S_DIV from the frequency divider 140. The phase frequency detector 110 may detect a phase difference and a frequency difference of the third clock signal S3 and the divided clock signal S_DIV, and may generate a detection signal Det corresponding to the detected phase difference and frequency difference. For example, the detection signal Det may include an up signal and a down signal. Further, when the frequency of the third clock signal S3 is matched with that of the divided clock signal S_DIV, the phase frequency detector 110 may activate the up signal or the down signal in accordance with a sign of the phase difference between the third clock signal S3 and the divided clock signal S_DIV.

The voltage generator 120 may receive the detection signal Det from the phase frequency detector 110, and may generate a control voltage Vctrl based on the detection signal Det. The control voltage Vctrl may have a magnitude dependent on a phase difference indicated by the detection signal Det. For example, the voltage generator 120 may include a charge pump and a loop filter. The voltage generator 120 may increase a level of the control voltage Vctrl when a phase of the divided clock signal S_DIV is lagging behind the third clock signal S3, and may decrease the level of the control voltage Vctrl when a phase of the third clock signal S3 is lagging behind the divided clock signal S_DIV. Therefore, in a state that the loop is locked, the voltage generator 120 may generate a control voltage Vctrl of a certain magnitude. For example, the loop may be locked when the divided clock signal S_DIV is in phase with the third clock signal S3.

The voltage controlled oscillator 130 may receive the control voltage Vctrl, and may generate an output clock signal Sout having a frequency based on the control voltage Vctrl.

The output clock signal Sout may be fed back to the frequency divider 140, and the frequency divider 140 may divide the feedback output clock signal Sout to generate the divided clock signal S_DIV. The frequency divider 140 may also provide the generated divided clock signal S_DIV to the phase frequency detector 110. For example, the frequency divider 140 may divide the output clock signal Sout depending on a ratio between the frequency of the third clock signal S3 and a target frequency of the output clock signal Sout.

The frequency multiplier 200 may receive an input clock signal Sin from the outside, and may output the third clock signal S3 based on the input clock signal Sin. In this case, the frequency of the third clock signal S3 may be greater than that of the input clock signal Sin. That is, the frequency multiplier 200 may increase the frequency of the input clock signal Sin. The frequency multiplier 200 may provide the third clock signal S3 having a frequency greater than that of the input clock signal Sin to the clock generator 100, thereby reducing noise generated in the clock generator 100 that includes a PLL circuit. Although the frequency multiplier 200 is shown to be separate from the clock generator 100, the frequency multiplier 200 may be implemented to be included in the clock generator 100 in another embodiment.

Figure 2:
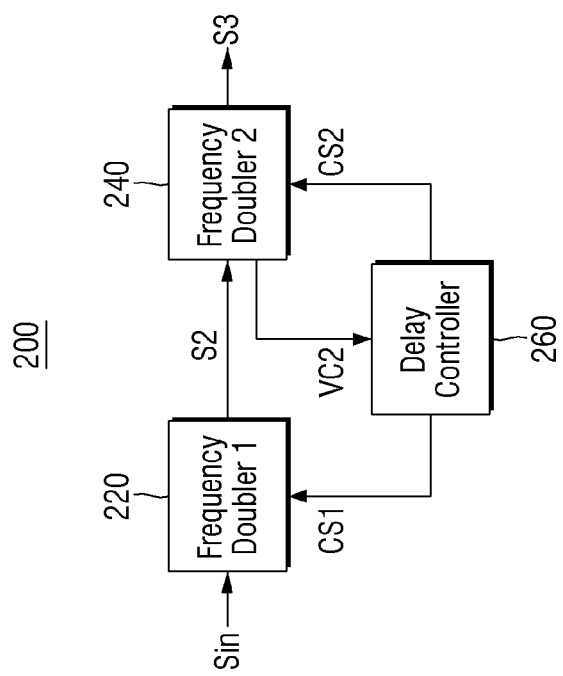
FIG. 2 is a block diagram illustrating a frequency multiplier of FIG. 1 according to an embodiment of the disclosure.
Figure 3:
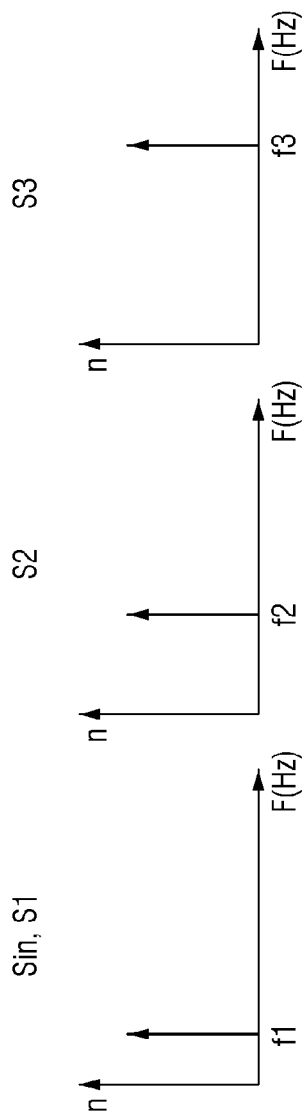
FIG. 3 is a diagram illustrating the frequency multiplier of FIG. 2 according to an embodiment of the disclosure.

Referring to FIGS. 2 and 3, the frequency multiplier 200 may include a first frequency doubler 220 (e.g., a doubler circuit or a first frequency multiplier), a second frequency doubler 240 (e.g., a doubler circuit or a second frequency multiplier), and a delay controller 260 (e.g., a control circuit).

The first frequency doubler 220 may receive the input clock signal Sin and convert the input clock signal Sin into a second clock signal S2. The first frequency doubler 220 may convert the input clock signal Sin into the second clock signal S2 based on the first control signal CS1 from the delay controller 260. The first frequency doubler 220 may provide the generated second clock signal S2 to the second frequency doubler 240. In this case, the input clock signal Sin may have a first frequency f1, and the second clock signal S2 may have a second frequency f2. In an embodiment, the second frequency f2 is greater than the first frequency f1. For example, the second frequency f2 may be twice the first frequency f1. That is, the first frequency doubler 220 may output the second clock signal S2 having a frequency twice that of the input clock signal Sin.

The second frequency doubler 240 may receive the second clock signal S2 from the first frequency doubler 220, and may convert the second clock signal S2 into the third clock signal S3. The second frequency doubler 240 may convert the second clock signal S2 into the third clock signal S3 based on the second control signal CS2 from the delay controller 260. The second frequency doubler 240 may provide the generated third clock signal S3 to the clock generator 100. The third clock signal S3 may have a third frequency f3. In an embodiment, the third frequency f3 is greater than the first frequency f1 and the second frequency f2. For example, the third frequency f3 may be twice the second frequency f2, and may be four times that of the first frequency f1. That is, the second frequency doubler 240 may output the third clock signal S3 having a frequency twice that of the second clock signal S2. Also, the second frequency doubler 240 may provide a second comparison signal VC2 generated by monitoring the third clock signal S3 to the delay controller 260. The second comparison signal VC2 may be implemented in the form of a voltage, and may include information on the second clock signal S2.

The delay controller 260 may generate a first control signal CS1 and a second control signal CS2 based on the second comparison signal VC2 received from the second frequency doubler 240. The delay controller 260 may provide the first control signal CS1 to the first frequency doubler 220 and provide the second control signal CS2 to the second frequency doubler 240 to control the first and second frequency doublers 220 and 240. Although the delay controller 260 is shown to be separate from the first and second frequency doublers 220 and 240, the delay controller 260 may be implemented as a part of the first and second frequency doublers 220 and 240. This will be described later in more detail.

Hereinafter, the frequency multiplier 200 will be described with reference to FIGS. 4 and 13.

Figure 4:
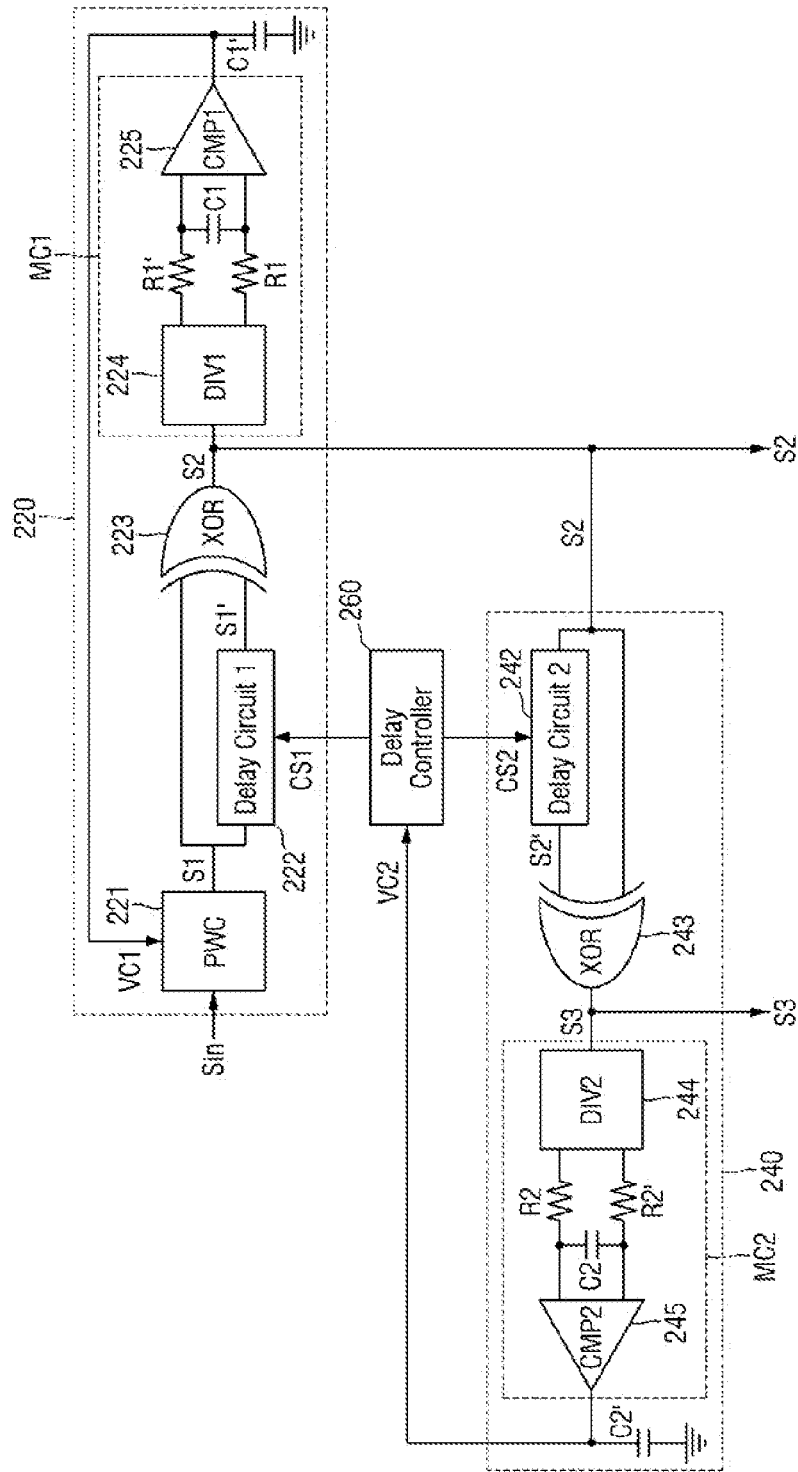
FIG. 4 is a block diagram illustrating a frequency multiplier according to an embodiment of the disclosure.
Figure 5:
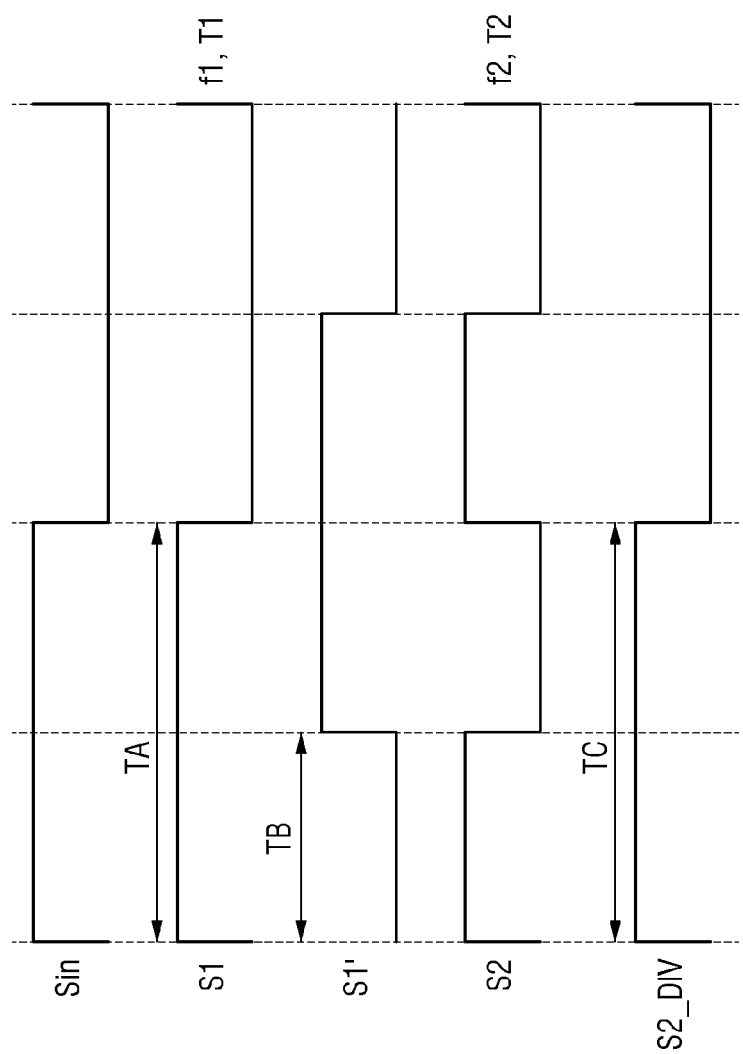
FIG. 5 is a timing diagram illustrating an operation of the frequency multiplier of FIG. 4 according to an embodiment of the disclosure.

FIG. 4 is a block diagram illustrating a frequency multiplier according to an embodiment of the disclosure FIG. 5 is a timing diagram illustrating an operation of the frequency multiplier of FIG. 4.

Referring to FIG. 4, the first frequency doubler 220 may include a pulse width control circuit 221, a first delay circuit 222, an exclusive OR gate (XOR) 223, and a first monitoring circuit MC1.

The pulse width control circuit 221 may receive the input clock signal Sin and control a duty cycle of the input clock signal Sin based on a first comparison signal VC1. In this case, the duty cycle may indicate a ratio of logic high to logic low occupied in a period of a signal. For example, when the period of the signal is 1 second and the time occupied by the logic high of the signal is 0.5 second, the duty cycle of the corresponding signal may be 0.5. The duty cycle may be expressed as a duty ratio, but the term duty cycle is used herein. The pulse width control circuit 221 may output the first clock signal S1 that controls the duty cycle of the input clock signal Sin. For example, the duty cycle of the input clock signal Sin need not be 50%, but a duty cycle of the first clock signal S1 may correspond to approximately 50%. Referring to FIG. 5, the first clock signal S1 has a first frequency f1 and a first period T1. The duty cycle of the first clock signal S1 may be a first time interval TA/a first period T1. The duty cycle of the first clock signal S1 controlled by the pulse width control circuit 221 may be 50%.

The first delay circuit 222 may receive and delay the first clock signal S1 to generate a first delay clock signal S1'. The first delay circuit 222 may delay the first clock signal S1 based on the first control signal CS1 received from the delay controller 260. That is, the first delay circuit 222 may be controlled by the delay controller 260. The first delay clock signal S1' may be different from the first clock signal S1 by as much as a second time interval TB. That is, the first clock signal S1 may be delayed by as much as the second time interval TB to generate the first delay clock signal S1'. The first delay clock signal S1' may have a first frequency f1 and a first period T1 in the same manner as the first clock signal S1, but the embodiments of the present disclosure are not limited thereto. The first delay circuit 222 may provide the generated first delay clock signal S1' to the exclusive OR gate 223.

The exclusive OR gate 223 may receive the first clock signal S1 from the pulse width control circuit 221, and may receive the first delay clock signal S1' from the first delay circuit 222. The exclusive OR gate 223 may be comprised of a plurality of transistors to perform an exclusive OR computation. That is, the exclusive OR gate 223 may perform an exclusive OR computation using the first clock signal S1 and the first delay clock signal S1'. As a result, the exclusive OR gate 223 may output the second clock signal S2. The second clock signal S2 has a second frequency f2 and a second period T2. In an embodiment, the second frequency f2 is twice the first frequency f1. In an embodiment of the present disclosure, a duty cycle of the second clock signal S2 is maintained at 50%. That is, the duty cycle of the second clock signal S2 may be maintained at 50% in accordance with the generation of the first delay clock signal S1' by the first delay circuit 222. Therefore, the duty cycle of the second clock signal S2 output from the first frequency doubler 220 may be maintained at 50%. However, embodiments according to the present disclosure are not limited thereto.

The first monitoring circuit MC1 may include a first divider 224, first resistors R1 and R1', a first capacitor C1, and a first comparator 225 (e.g., a comparator circuit or operational amplifier). The first divider 224 may receive and divide the second clock signal S2 to generate a second divided clock signal S2_DIV. Duty cycle information of the divided second clock signal S2_DIV may be generated through the first resistors R1 and R1' and the first capacitor C1. The second divided clock signal S2_DIV generated by the first divider 224 may have a logic high period equivalent to a third time interval TC. At this time, the second divided clock signal S2_DIV may be generated in accordance with a rising edge of the second clock signal S2. For example, the frequency of the second divided clock signal S2_DIV may be equal to that of the first clock signal S1. That is, the first monitoring circuit MC1 may divide the second clock signal S2 to monitor the first clock signal S1.

The first comparator 225 may receive and compare a plurality of second divided clock signals S2_DIV from the first divider 224. Duty cycle information of the second divided clock signal S2_DIV generated through the first resistors R1 and R1' and the first capacitor C1 may be transferred to the first comparator 225 as voltages, and the first comparator 225 may compare the voltages. When one second divided clock signal S2_DIV is greater than the other second divided clock signal S2_DIV, the first comparator 225 may output 1, and when one second divided clock signal S2_DIV is smaller than the other second divided clock signal S2_DIV, the first comparator 225 may output 0. That is, the first comparison signal VC1 output from the first comparator 225 may correspond to this value. The first comparison signal VC1 may include information on the duty cycle of the first clock signal S1. The first comparison signal VC1 may be transferred to the pulse width control circuit 221, whereby feedback for the first clock signal S1 may be performed.

Figure 6:
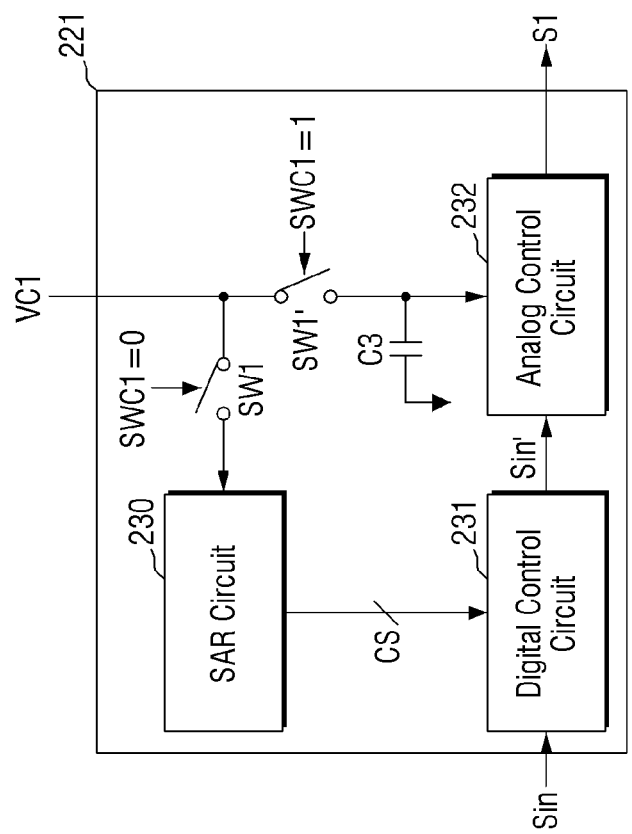
FIG. 6 is a block diagram illustrating the pulse width control circuit of FIG. 4 according to an embodiment of the disclosure.
Figure 7:
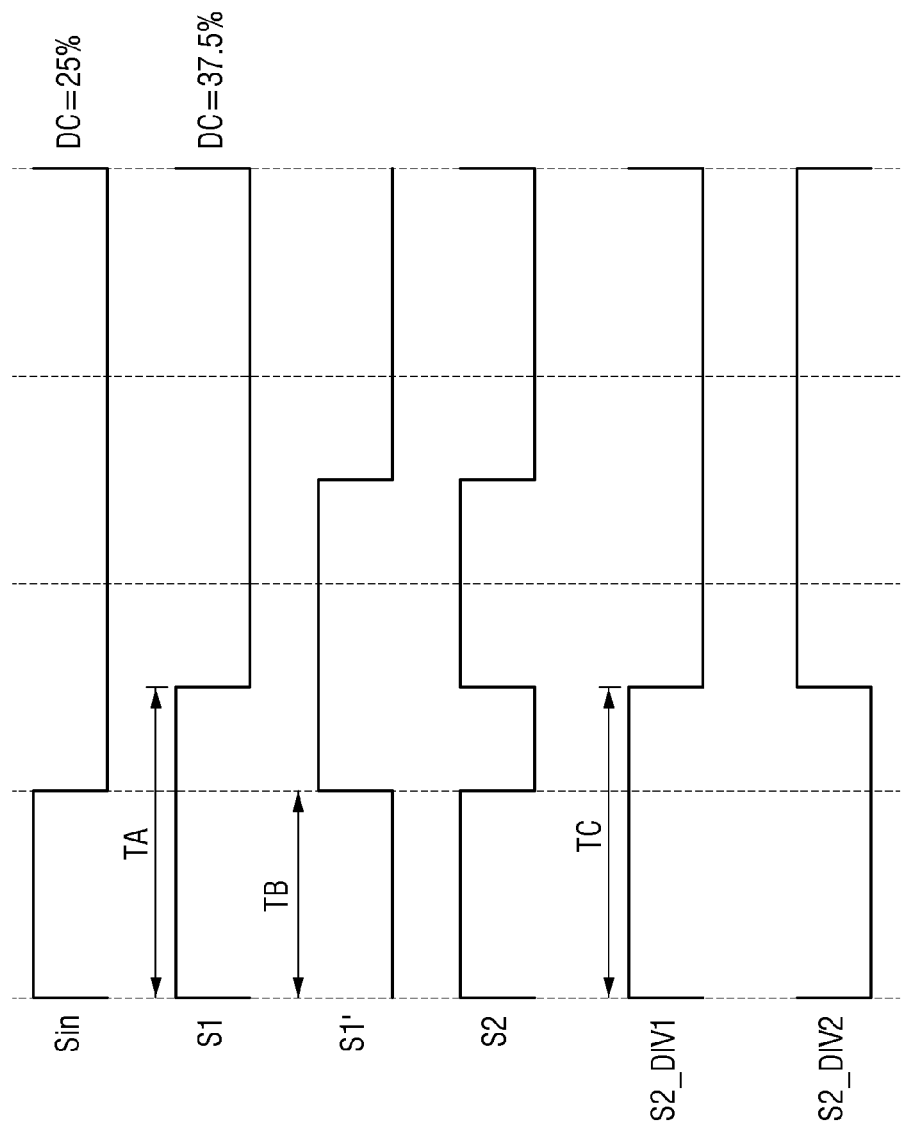
FIG. 7 is a timing diagram illustrating the operation of the pulse width control circuit of FIG. 4.
Figure 8:
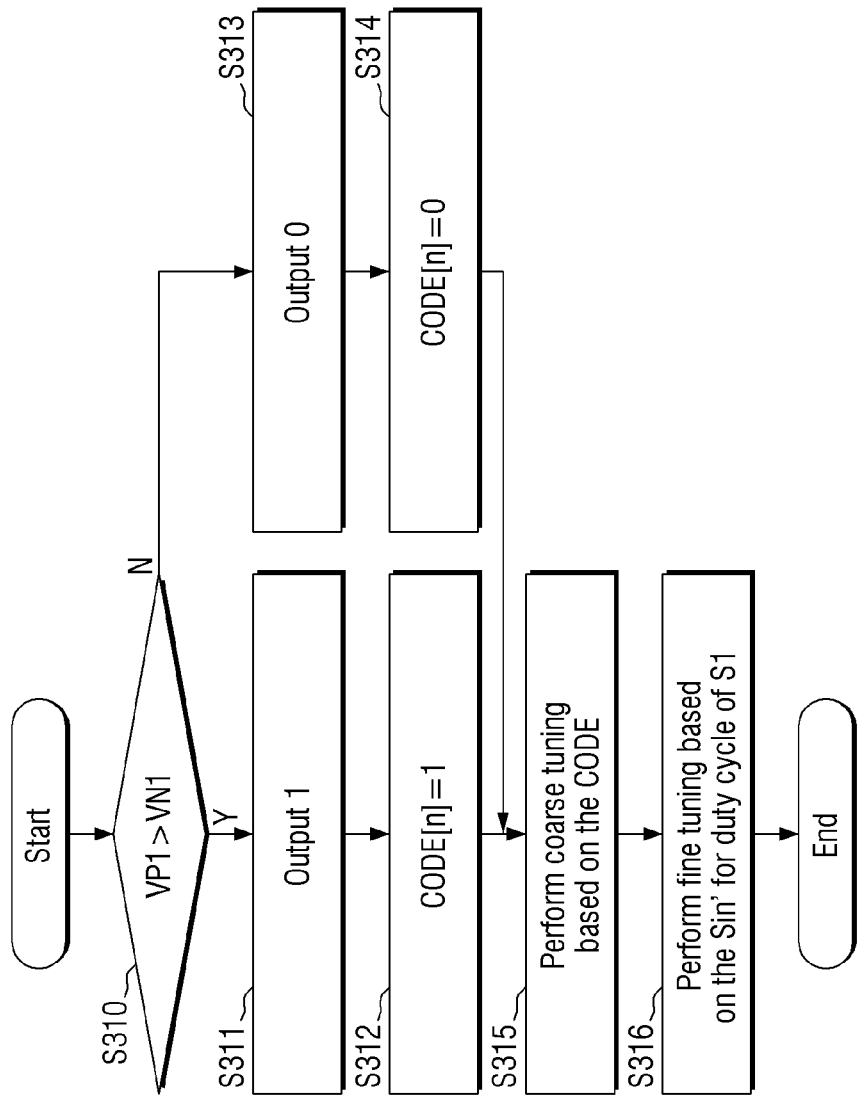
FIG. 8 is a flow chart illustrating an operation of the pulse width control circuit of FIG. 4 according to an embodiment of the disclosure.

FIG. 6 is a block diagram illustrating the pulse width control circuit of FIG. 4. FIG. 7 is a timing diagram illustrating the operation of the pulse width control circuit of FIG. 4. FIG. 8 is a flow chart illustrating the operation of the pulse width control circuit of FIG. 4.

Referring to FIG. 6, the pulse width control circuit 221 may include a successive approximation register (SAR) circuit 230, a digital control circuit 231, an analog control circuit 232, a first switch SW1, and a first switch SW1'. The first switch SW1 and the first switch SW1' may receive the first comparison signal VC1 from the first monitoring circuit MC1, and may selectively transfer the first comparison signal VC1 to the SAR circuit 230 and the analog control circuit 232 in accordance with a first switch control signal SWC1. For example, when the first switch control signal SWC1 is 0, the first comparison signal VC1 may be provided to the SAR circuit 230, and when the first switch control signal SWC1 is 1, the first comparison signal VC1 may be provided to the analog control circuit 232.

The SAR circuit 230 may provide a control signal CS having a plurality of bits to the digital control circuit 231 based on the first comparison signal VC1 to control the duty cycle of the input clock signal Sin.

Referring to FIGS. 6 and 8, the SAR circuit 230 determines whether a first voltage VP1 is greater than a second voltage VN1 (S310). The SAR circuit 230 may start to compare generated codes in the order of the most significant bit (MSB). When the first voltage VP1 is greater than the second voltage VN1 (S310-Y), the first comparator 225 may output 1 (S311), and the SAR circuit 230 that has received the first comparison signal VC1 of 1 may maintain the current bit of the code at 1 and generate next bit of the code as 1 (S312). When the first voltage VP1 is not greater than the second voltage VN1 (S310-N), the first comparator 225 may output 0 (S313), and the SAR circuit 230 that has received the first comparison signal VC1 of 0 may change the current bit of the code to 0, and may generate a next bit of the code as 1 (S314). That is, when the first voltage VP1 is smaller than the second voltage VN1 as shown in FIG. 7, the first comparator 225 may output 0, and the SAR circuit 230 may generate a code of 0.

The control signal CS provided to the digital control circuit 231 from the SAR circuit 230 may include a plurality of bits. In this case, the control signal CS may correspond to the code generated by the SAR circuit 230. For example, in case of FIG. 7, the MSB of the control signal CS may be a code corresponding to 1.

The digital control circuit 231 performs coarse tuning based on the generated code (S315). For example, when the generated code is 1, the digital control circuit 231 may control the duty cycle of the input clock signal Sin based on the code. That is, the digital control circuit 231 may generate an input clock signal Sin' having a duty cycle controlled based on the control signal CS provided from the SAR circuit. In this case, the control signal CS may be a code corresponding to six bits, and the digital control circuit 231 may output the input clock signal Sin' through duty cycle control of six times.

After performing the coarse tuning, the analog control circuit 232 may perform fine tuning based on the input clock signal Sin' to control the duty cycle of the first clock signal S1 (S316). For example, the analog control circuit 232 may precisely control the input clock signal Sin' using an analog voltage. As an approximate duty cycle of the input clock signal Sin' is controlled through the digital control circuit 231, the analog control circuit 232 may output the first clock signal S1 with only a slight control. That is, the analog control circuit 232 may use less power, and noise which is generated may be reduced. At this time, the analog control circuit 232 may receive a signal from the first comparator 225. At this time, the first comparator 225 may operate as an amplifier. In addition, when the analog control circuit 232 receives a signal from the first comparator 225, the analog control circuit 232 may be connected to a third capacitor C1'.

The pulse width control circuit 221 may generate the first clock signal S1 of which duty cycle has been controlled, through the above process. In this case, the duty cycle of the first clock signal S1 may be 50%. The pulse width control circuit 221 may control the duty cycle based on the input clock signal Sin and the first clock signal S1, each of which has a first frequency f1. That is, the pulse width control circuit 221 may consume power based on the first frequency f1.

Referring back to FIG. 4, the second frequency doubler 240 may be connected to the first frequency doubler 220. The second frequency doubler 240 may receive the second clock signal S2.

The second frequency doubler 240 may include a second delay circuit 242, an exclusive OR gate 243, and a second monitoring circuit MC2. The second frequency doubler 240 does not include a pulse width control circuit like the pulse width control circuit 221 of the first frequency doubler 220. That is, the second frequency doubler 240 does not perform an operation of controlling the duty cycle of the second clock signal S2. Since the second frequency doubler 240 does not include a pulse width control circuit that controls the duty cycle of the second clock signal S2, power consumption of the second frequency doubler 240 may be reduced.

The second delay circuit 242 may receive the second clock signal S2. In addition, the second delay circuit 242 may be directly connected to the first frequency doubler 220. That is, the second delay circuit 242 may be directly connected to the exclusive OR gate 223 of the first frequency doubler 220. That is, the second frequency doubler 240 does not include other modules between the second delay circuit 242 and the exclusive OR gate 223.

The second delay circuit 242 may delay the second clock signal S2 based on the second control signal CS2 to generate a second delay clock signal S2'. The second delay circuit 242 may delay the second clock signal S2 based on the second control signal CS2 received from the delay controller 260. That is, the second delay circuit 242 may be controlled by the delay controller 260. The second delay circuit 242 may provide the generated second delay clock signal S2' to the exclusive OR gate 243.

The exclusive OR gate 243 may be directly connected to the first frequency doubler 220. That is, the exclusive OR gate 243 may be directly connected to the exclusive OR gate 223 of the first frequency doubler 220. In addition, the exclusive OR gate 243 may be directly connected to the second delay circuit 242. That is, the second frequency doubler 240 does not include other modules between the exclusive OR gate 243 and the exclusive OR gate 223.

The exclusive OR gate 243 may receive the second delay clock signal S2' from the second delay circuit 242, and may receive the second clock signal S2 from the first frequency doubler 220. The exclusive OR gate 243 may be comprised of a plurality of transistors to perform an exclusive OR computation. That is, the exclusive OR gate 243 may perform an exclusive OR computation using the second clock signal S2 and the second delay clock signal S2'. As a result, the exclusive OR gate 243 may output a third clock signal S3. The third clock signal S3 has a third frequency f3 and a third period T3. In an embodiment, the third frequency f3 is twice the second frequency f2. In the embodiment of the present disclosure, a duty cycle of the third clock signal S3 may be maintained at 50%. That is, the duty cycle of the third clock signal S3 may be maintained at 50% in accordance with the generation of the second delay clock signal S2' by the second delay circuit 242. However, embodiments of the present disclosure are not limited thereto, and the duty cycle of the third clock signal S3 need not be 50%.

The second monitoring circuit MC2 may include a second divider 244, second resistors R2 and R2', a second capacitor C2, and a second comparator 245. The second divider 244 may receive and divide the third clock signal S3. Duty cycle information of the divided third clock signal S3 may be generated through the second resistors R2 and R2' and the second capacitor C2. The frequency of the divided clock signal generated by the second divider 244 may be the same as that of the second clock signal S2. Therefore, the second monitoring circuit MC2 may divide the third clock signal S3 to monitor the second clock signal S2.

The second comparator 245 may receive and compare a plurality of divided clock signals from the second divider 244. The second comparator 245 may provide the second comparison signal VC2 to the delay controller 260. The second comparison signal VC2 may include information on the duty cycle of the second clock signal S2. Therefore, since the delay controller 260 controls a delay amount for the first clock signal S1 and the second clock signal S2 based on the second comparison signal VC2, feedback for the second and third clock signals S2 and S3 may be performed. This will be described in more detail.

Figure 9:
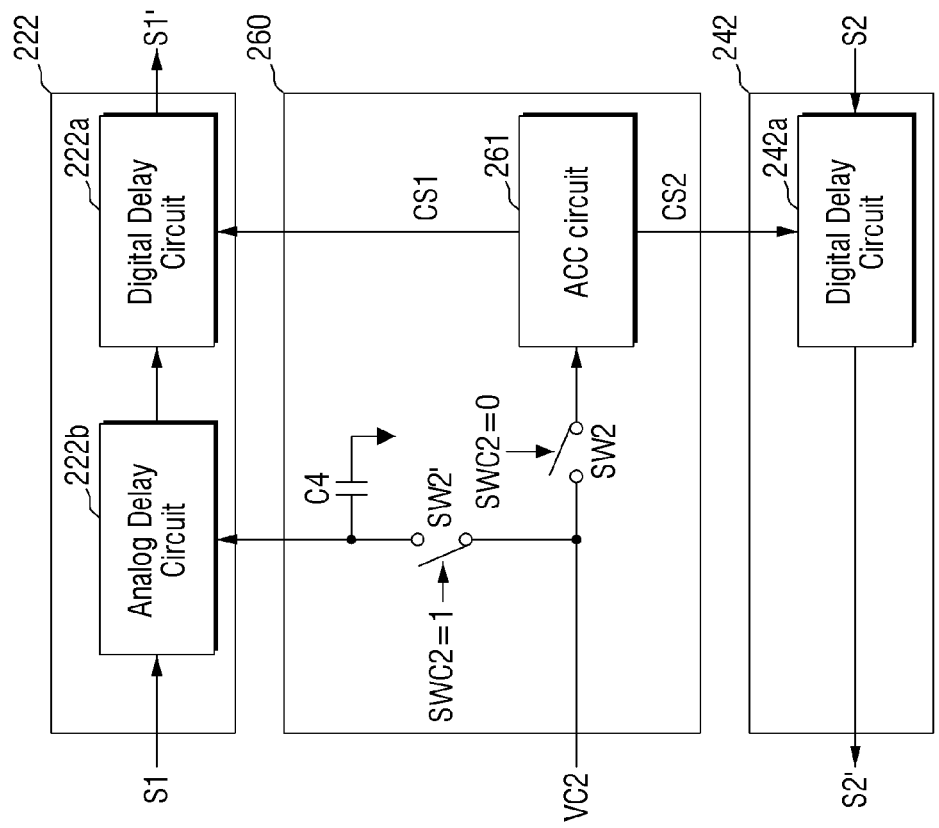
FIG. 9 is a block diagram illustrating a first delay circuit, a second delay circuit, and a delay controller of FIG. 4 according to an embodiment of the disclosure.
Figure 10:
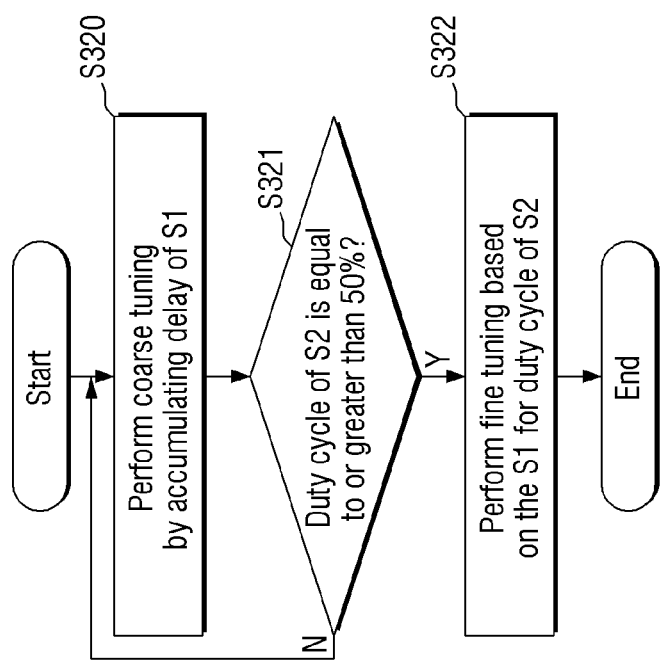
FIG. 10 is a block diagram illustrating the delay controller of FIG. 4. according to an embodiment of the disclosure
Figure 11:
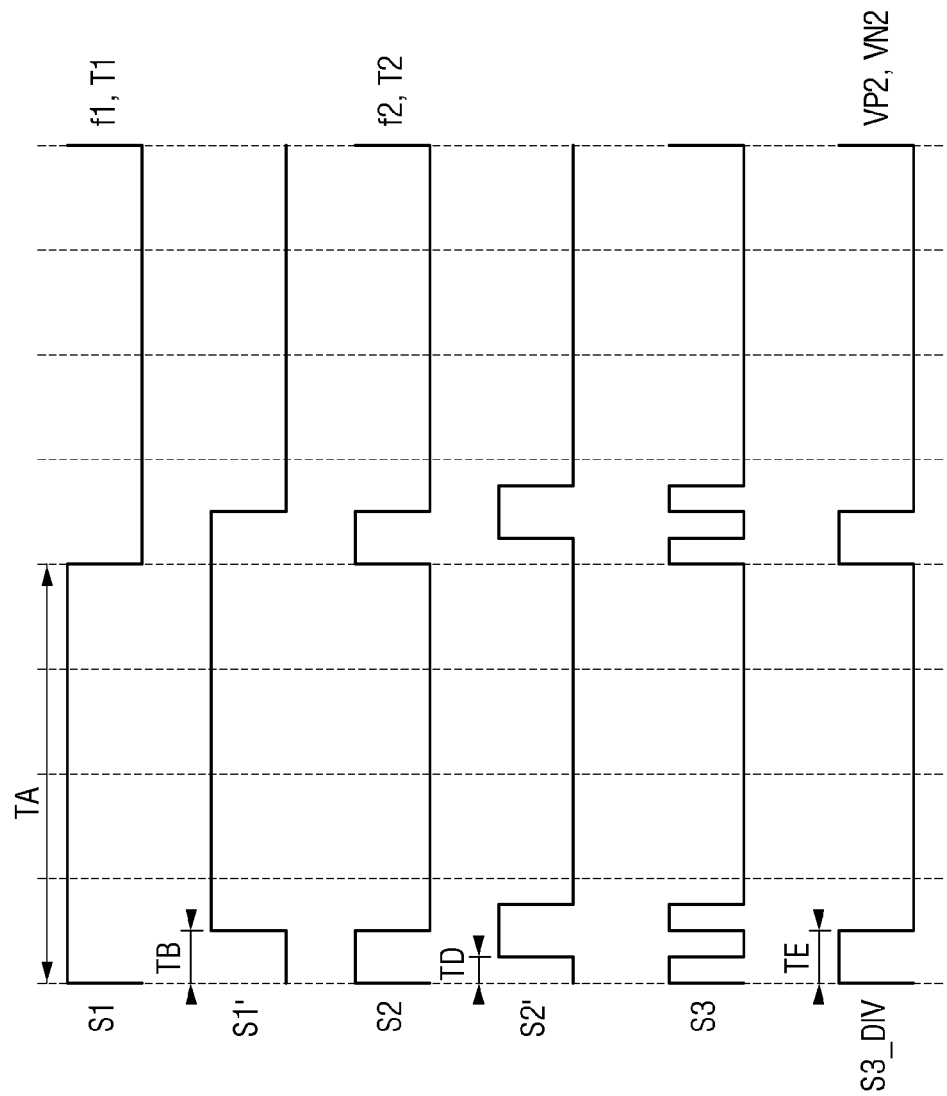
FIGS. 11 and 12 are timing diagrams illustrating an operation of the delay controller of FIG. 4 according to an embodiment of the disclosure.
Figure 12:
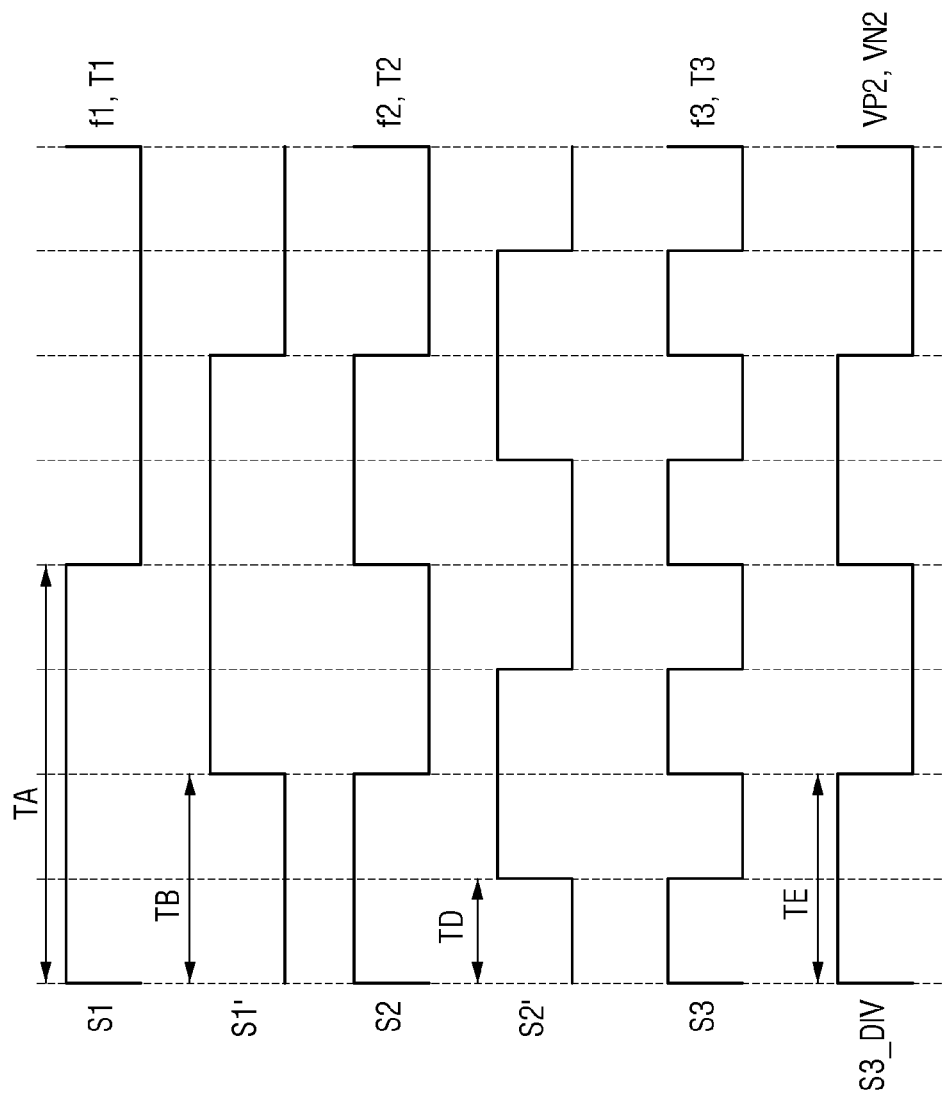

FIG. 9 is a block diagram illustrating the first delay circuit, the second delay circuit, and the delay controller of FIG. 4. FIG. 10 is a block diagram illustrating the delay controller of FIG. 4. FIGS. 11 and 12 are timing diagrams illustrating the operation of the delay controller of FIG. 4.

Referring to FIG. 9, the first delay circuit 222 may include a digital delay circuit 222a and an analog delay circuit 222b. The second delay circuit 242 may include a digital delay circuit 242a. The delay controller 260 may include an accumulation circuit 261, a second switch SW2, and a second switch SW2'. The second switch SW2 and the second switch SW2' may be controlled by a second switch control signal SWC2. For example, when the second switch control signal SWC2 is 0 (zero or logic low), the second comparison signal VC2 may be transferred to the accumulation circuit 261 through the second switch SW2, and when the second switch control signal SWC2 is 1 (or logic high), the second comparison signal VC2 may be transferred to the analog delay circuit 222b through the second switch SW2'.

The delay controller 260 may include an accumulation circuit 261, and may output the first control signal CS1 to control the first delay circuit 222 and the second control signal CS2 to control the second delay circuit 242. For example, the first delay circuit 222 may delay the first clock signal S1 based on the first control signal CS1 output from the accumulation circuit 261 to generate the first delayed clock signal S1'. The second delay circuit 242 may delay the second clock signal S2 based on the second control signal CS2 output from the accumulation circuit 261 to generate the second delay clock signal S2'. At this time, the first control signal CS1 may correspond to 5 bits, and the second clock signal CS2 may correspond to 4 bits. However, embodiments of the present disclosure are not limited thereto.

Referring to FIG. 10, the first delay circuit 222 and the delay controller 260 perform coarse tuning by accumulating the delay amount of the first clock signal S1 (S320). Referring to FIGS. 9 and 11, the first clock signal S1 may be input to the first delay circuit 222 and then converted into the first delay clock signal S1'. That is, the digital delay circuit 222a may generate the first delay clock signal S1' based on the first control signal CS1. The first delay clock signal S1' may be a signal delayed from the first clock signal S1 by as much as the second time interval TB. At this time, the second time period TB may correspond to a value controlled by the first control signal CS1 from the accumulation circuit 261. The first frequency doubler 220 may generate the second clock signal S2 based on the first clock signal S1 and the first delay clock signal S1'. In an embodiment, the second clock signal S2 has a duty cycle smaller than 50%.

The second clock signal S2 may be input to the second delay circuit 242 and then converted into the second delay clock signal S2'. That is, the digital delay circuit 242a may generate the second delay clock signal S2' based on the second control signal CS2. The second delay clock signal S2' may be a signal delayed from the second clock signal S2 by as much as a fourth time interval TD. In this case, the fourth time interval TD may correspond to a value controlled by the second control signal CS2 from the accumulation circuit 261, and may be smaller than the second time interval TB. For example, the fourth time interval TD may be twice smaller than the second time interval TB, but embodiments of the present disclosure are not limited thereto.

The second frequency doubler 240 may generate the third clock signal S3 based on the second clock signal S2 and the second delay clock signal S2'. At this time, the third clock signal S3 may not have a frequency desired by the frequency multiplier 200. A third divided clock signal S3_DIV generated by the second monitoring circuit MC2 may be the same waveform as that of the second clock signal S2. That is, a duty cycle of the third divided clock signal S3_DIV may be a ratio of a fifth time interval TE and the second period T2, which is equal to the duty cycle of the second clock signal S2. The second monitoring circuit MC2 may output the second comparison signal VC2 using the generated first voltage VP2 and second voltage VN2. The second comparison signal VC2 may include information on the duty cycle of the third divided clock signal S3_DIV or the duty cycle of the second clock signal S2.

The accumulation circuit 261 may receive the second comparison signal VC2, and may accumulate the delay amount of the first clock signal S1 and the second clock signal S2 based on the received second comparison signal VC2. For example, the accumulation circuit 261 may provide the first control signal CS1 and the second control signal CS2 to the digital delay circuit 222a and the digital delay circuit 242a to have a delay amount greater than a previous delay amount, thereby delaying the first clock signal S1 and the second clock signal S2.

The accumulation circuit 261 determines whether the duty cycle (DC) of the second clock signal S2 is greater than or equal to 50% (S321). For example, the accumulation circuit 261 may continue to increase the delay amount of the first clock signal S1. Referring to FIG. 12, the digital delay circuit 222a of the first delay circuit 222 may generate the first delay clock signal S1' based on the first control signal CS1. In this case, the delay amount of the first delay clock signal S1' may correspond to the second time interval TB. The second time interval TB in FIG. 12 may be greater than the second time interval TB in FIG. 11. That is, the second time interval TB may be increased by the operation of the accumulation circuit 261. When the duty cycle of the second clock signal S2 reaches 50% or more (S321-Y), the first delay circuit 222 performs fine tuning based on the first clock signal S1 to control the duty cycle of the second clock signal S2 (S322). For example, the digital delay circuit 222a does not perform a delay operation, and the digital delay circuit 222b may only perform a delay operation for the first clock signal S1. In this case, since the first clock signal S1 is adjusted to the first delay clock signal S1' by the digital delay circuit 222a, the analog delay circuit 222b may perform only a slight control. Therefore, the first delay circuit 222 may consume less power, and little or no noise may be generated. At this time, the analog delay circuit 222b may receive a signal from the second comparator 245. At this time, the second comparator 245 may operate as an amplifier. In addition, when the analog delay circuit 222b receives a signal from the second comparator 245, the analog delay circuit 222b may be connected to a fourth capacitor C2'. In addition, when the duty cycle of the generated second clock signal S2 is not more than 50% (S321-N), the first delay circuit 222 and the second delay circuit 242 may continue to generate the first control signal CS1 and the second control signal CS2.

Referring to FIGS. 9 and 12, the second clock signal S2 may have a duty cycle of 50%. That is, the second clock signal S2 having a duty cycle of 50% may be generated in accordance with the generation of the first delay clock signal S1'. The digital delay circuit 242a may generate the second delay clock signal S2' delayed by as much as the fourth time interval TD. The second delay clock signal S2' may also be generated by the second control signal CS2. The third clock signal S3 generated based on the second clock signal S2 and the second delay clock signal S2' may have a duty cycle of 50%, but embodiments of the present disclosure are not limited thereto. The third clock signal S3 may have a duty cycle different from 50%. In this case, the third clock signal S3 may have a third frequency f3 and a third period T3. In this case, the third frequency f3 may be twice the second frequency f2 or four times of the first frequency f1.

Figure 13:
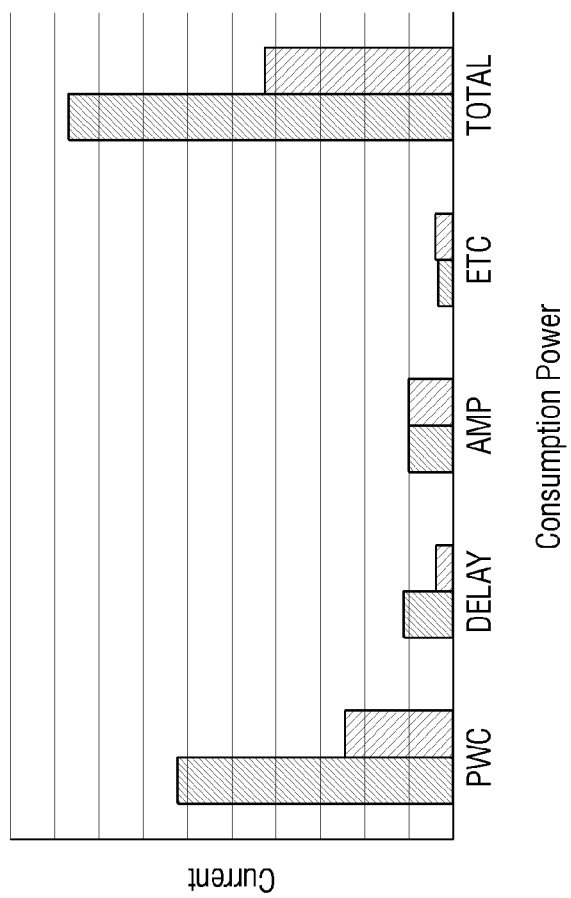
FIG. 13 is a graph illustrating a consumption power of a clock generating circuit of the present disclosure.

FIG. 13 is a graph illustrating power consumption of a clock generating circuit of the present disclosure.

Referring to FIG. 13, the frequency multiplier 200 of the clock generating circuit may consume power. In this case, a graph corresponding to a left side of each item is a power consumption of a frequency quadrupler that connects two frequency doublers in series, and a graph corresponding to a right side of each item is a power consumption of the frequency multiplier 200 according to the embodiment of the present disclosure.

Referring to FIG. 4, the pulse width control circuit 221 included in the first frequency doubler 220 may operate based on the first clock signal S1. That is, the pulse width control circuit 221 may operate based on the first frequency f1, and in accordance with a formula of $P=C*V^2*f$, the pulse width control circuit 221 may consume power P corresponding to the first frequency f1. However, the second frequency doubler 240 does not include the pulse width control circuit 221. That is, the second frequency doubler 240 does not include the pulse width control circuit 221 that consumes power corresponding to the second frequency f2, and only includes the second delay circuit 242 that consumes power corresponding to the second frequency f2.

Referring back to FIG. 13, the power consumption of the pulse width control circuit 221 of the frequency multiplier 200 according to an embodiment of the present disclosure may be less than the power consumption of a pulse width control circuit of a frequency quadrupler that connects two frequency doublers in series. In addition, the power consumption of the frequency multiplier 200 according to an embodiment of the present disclosure may be less than the power consumption power of a frequency multiplier including a frequency quadrupler in which two frequency doublers are connected in series. That is, the frequency multiplier 200 according to the embodiment of the present disclosure may consume less power, and thus occurrences of noise may be reduced.

Hereinafter, a delay controller 260 and a second delay circuit 242 according to another embodiment will be described with reference to FIG. 14

Figure 14:
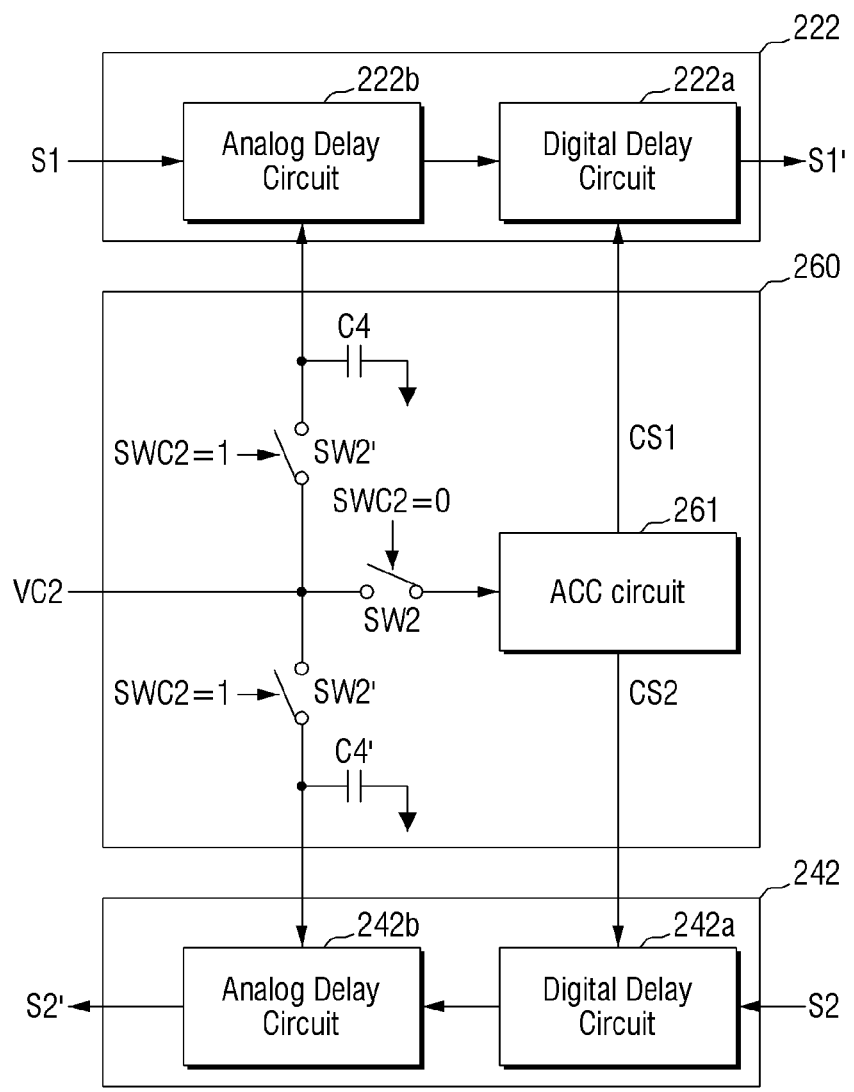
FIG. 14 is a block diagram illustrating a first delay circuit, a second delay circuit, and a delay controller according to an embodiment of the disclosure.

FIG. 14 is a block diagram illustrating a first delay circuit, a second delay circuit, and a delay controller according to an embodiment. For convenience of description, elements the same as that described using FIGS. 1 to 13 will briefly be described or omitted.

Referring to FIG. 14, the delay controller 260 may further include a second switch SW2", and the second delay circuit 242 may further include an analog delay circuit 242b. The second switch SW2" may operate when the second switch control signal SWC2 is 1. That is, the second switch SW2" may operate simultaneously with the first switch SW2', and the analog delay circuit 222b and the analog delay circuit 242b may operate at the same time. The analog delay circuit 242b may receive the second comparison signal VC2, and may receive the second clock signal S2 previously controlled by the digital delay circuit 242a. The analog delay circuit 242b may generate a second delay clock signal S2' based on the second comparison signal VC2 and the second clock signal S2. At this time, since the delay amount of the second clock signal S2 transferred from the digital delay circuit 242a has been controlled, the analog delay circuit 242b may perform a slight delay control for the second clock signal S2 to generate the second delay clock signal S2'. Also, the analog delay circuit 242b may perform finer tuning for the second clock signal S2 to generate the second delay clock signal S2'.

Hereinafter, a delay controller 260 and a second delay circuit 242 according to another embodiment will be described with reference to FIGS. 15 and 16.

Figure 15:
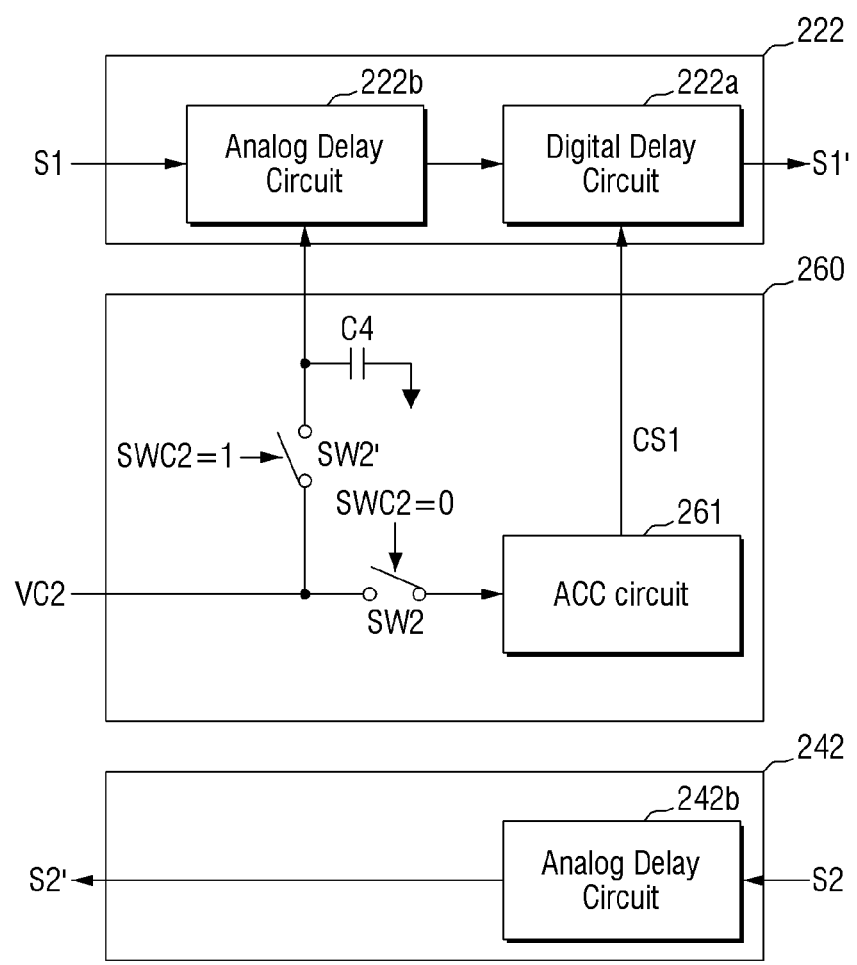
FIG. 15 is a block diagram illustrating a first delay circuit, a second delay circuit, and a delay controller according to an embodiment according to an embodiment of the disclosure.

FIG. 15 is a block diagram illustrating a first delay circuit, a second delay circuit, and a delay controller according to an embodiment. FIG. 16 is a timing diagram illustrating the operation of the second delay circuit of FIG. 15. For convenience of description, elements the same as that described using FIGS. 1 to 13 will briefly be described or omitted.

Referring to FIG. 15, the second delay circuit 242 may include an analog delay circuit 242b, and does not include a digital delay circuit. That is, the second delay circuit 242 may delay the second clock signal S2 using only the analog delay circuit 242b to generate the second delay clock signal S2'.

In this case, the accumulation circuit 261 of the delay controller 260 provides the first control signal CS1 to the first delay circuit 222, but does not provide a control signal to the second delay circuit 242. That is, the delay controller 260 may control the first delay circuit 222, but does not control the second delay circuit 242. For example, as shown in FIG. 15, the delay controller 260 does not provide a second control signal CS2 to the second delay circuit 242.

Figure 16:
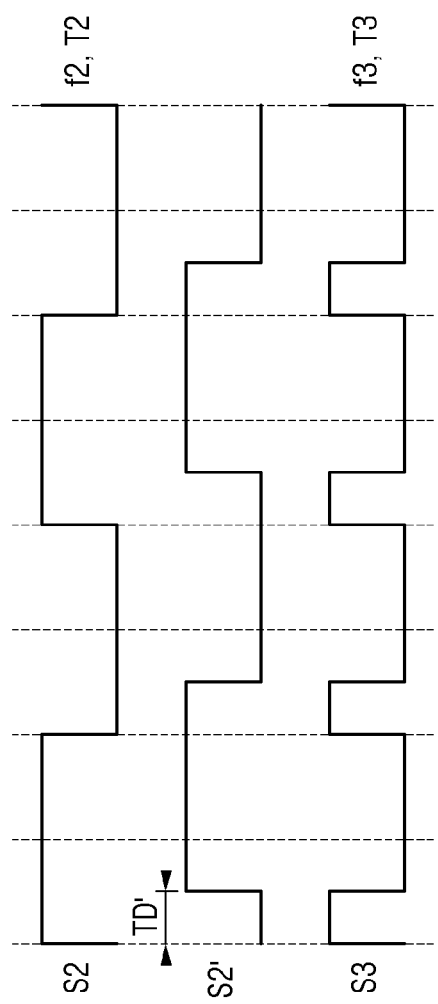
FIG. 16 is a timing diagram illustrating an operation of the second delay circuit of FIG. 15 according to an embodiment of the disclosure.

Referring to FIG. 16, the second clock signal S2 may be controlled by the delay controller 260 and the first delay circuit 222 to have a duty cycle of 50%. That is, the second clock signal S2 may be generated and controlled by the digital delay circuit 222a and the analog delay circuit 222b. The second delay circuit 242 may delay the second clock signal S2 to generate the second delay clock signal S2'. In this case, the second delay clock signal S2' may be a signal delayed from the second clock signal S2 by as much as the fourth time period TD'. The analog delay circuit 242b of the second delay circuit 242 may delay the second clock signal S2 without being controlled by the delay controller 260. That is, the second delay clock signal S2', which is output, may randomly be controlled by the analog delay circuit 242b.

The third clock signal S3 generated based on the second clock signal S2 and the second delay clock signal S2' may have a third frequency f3 and a third period T3. The duty cycle of the third clock signal S3 need not be 50%. However, a rising edge of the third clock signal S3 may only be used, and the third clock signal S3 maintains the third frequency f3, whereby the clock generator 100 may generate the output clock signal Sout by receiving and fixing the third clock signal S3. In an embodiment, fixing the third clock signal S3 means to maintain the frequency of the third clock signal S3.

Hereinafter, a frequency multiplier 200 according to an embodiment will be described with reference to FIG. 17.

Figure 17:
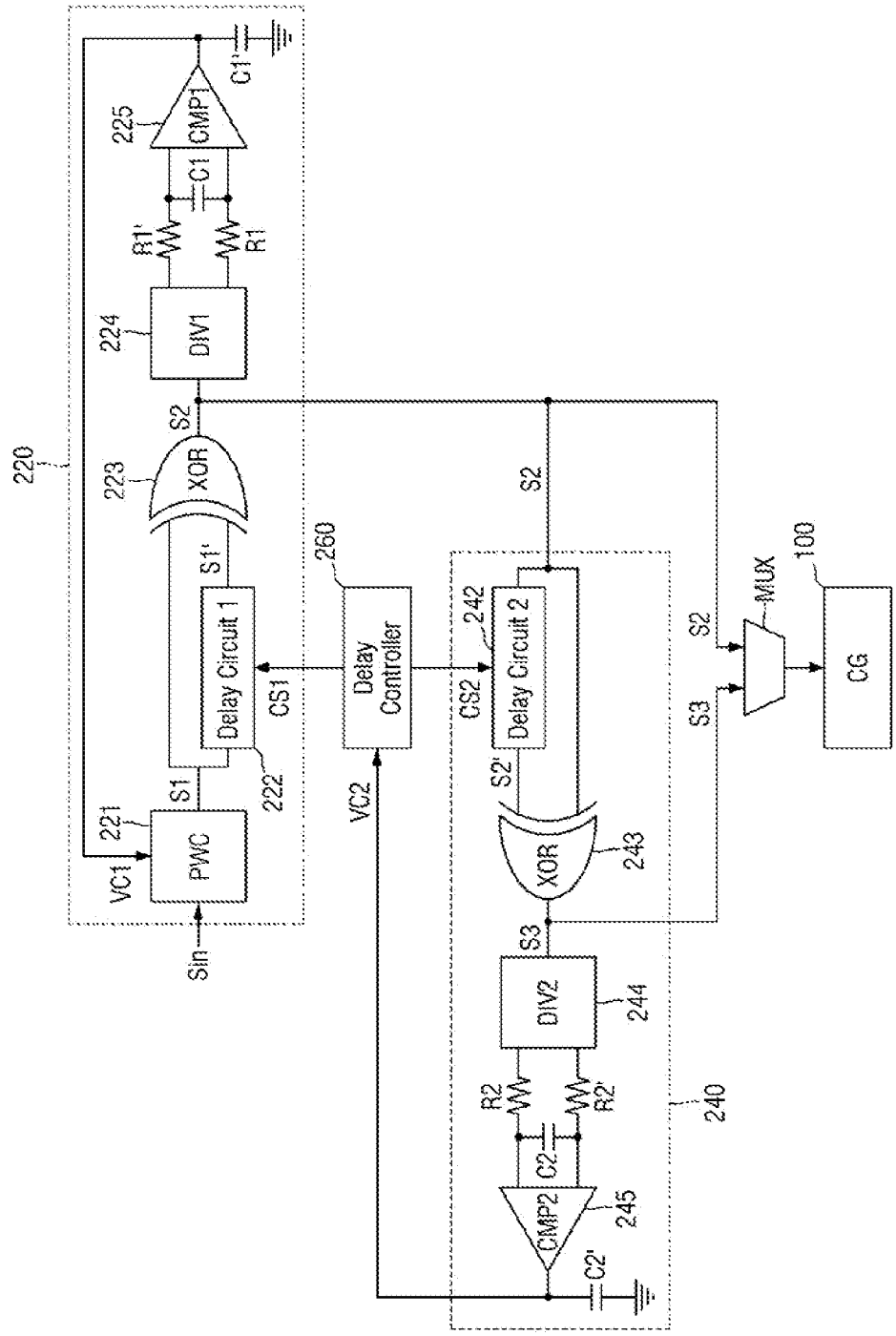
FIG. 17 is a block diagram illustrating a frequency multiplier according to an embodiment of the disclosure.

FIG. 17 is a block diagram illustrating a frequency multiplier according to an embodiments For convenience of description, elements the same as that described using FIGS. 1 to 13 will be briefly described or omitted.

Referring to FIG. 17, the frequency multiplier 200 may further include a multiplexer MUX. The multiplexer MUX may be connected to the first frequency doubler 220 and the second frequency doubler 240. The multiplexer MUX may receive the second clock signal S2 from the first frequency doubler 220 and receive the third clock signal S3 from the second frequency doubler 240. In this case, the second clock signal S2 may have a second frequency f2, and the third clock signal S3 may have a third frequency f3. The multiplexer MUX may output one of the received third clock signal S3 and second clock signal S2. The multiplexer MUX may provide one of the third clock signal S3 and the second clock signal S2 to the clock generator 100. Therefore, the clock generator 100 may receive a second clock signal S2 having a second frequency f2, and may receive a third clock signal S3 having a third frequency f3.

Hereinafter, a frequency multiplier 200' according to an embodiment will be described with reference to FIGS. 18 to 21.

Figure 18:
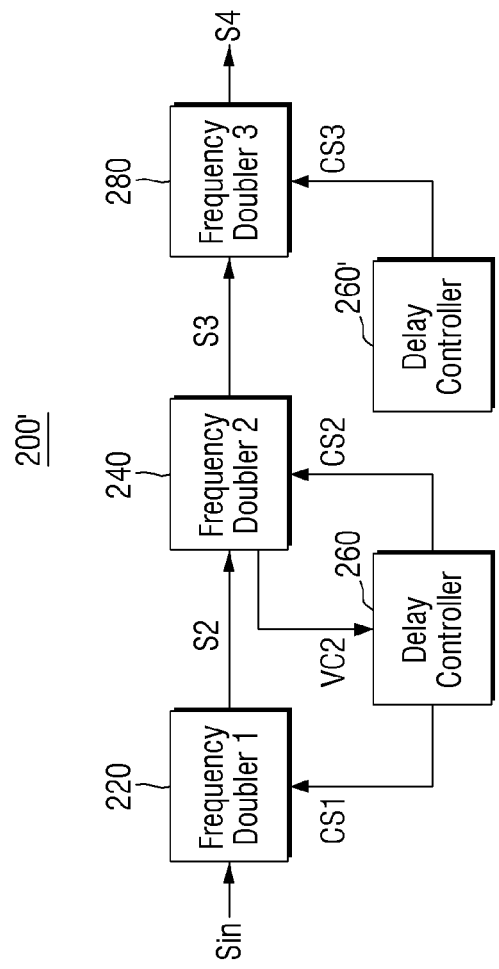
FIG. 18 is a block diagram illustrating a frequency multiplier according to an embodiment of the disclosure.
Figure 19:
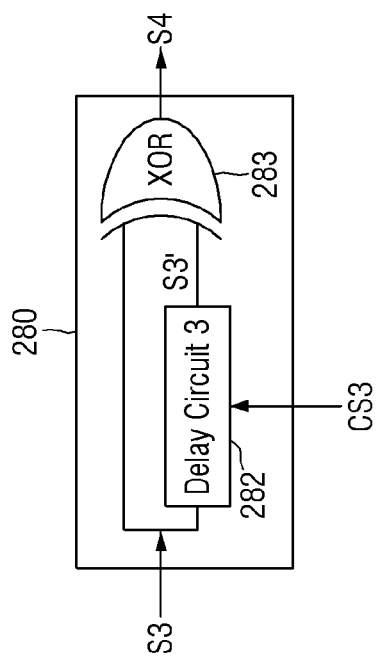
FIG. 19 is a block diagram illustrating a third frequency doubler of FIG. 18 according to an embodiment of the disclosure.
Figure 21:
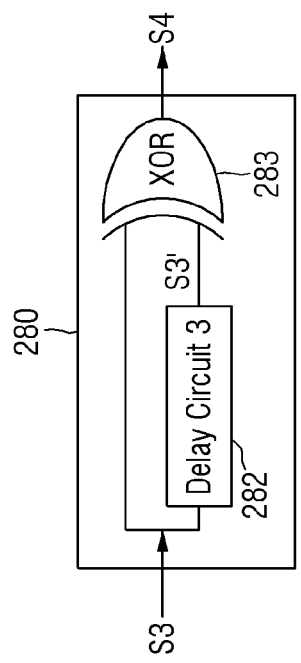
FIG. 21 is a block diagram illustrating a third frequency doubler according to an embodiment of the disclosure.

FIG. 18 is a block diagram illustrating a frequency multiplier according to an embodiment. FIG. 19 is a block diagram illustrating a third frequency doubler of FIG. 18. FIG. is a timing diagram illustrating the operation of the third frequency doubler of FIG. 19. FIG. 21 is a block diagram illustrating a third frequency doubler according to an embodiment. For convenience of description, elements the same as that described using FIGS. 1 to 13 will be briefly described or omitted.

Referring to FIG. 18, the frequency multiplier 200' may further include a third frequency doubler 280 and a delay controller 260'. The third frequency doubler 280 may be connected to the first and second frequency doublers 220 and 240. For example, the third frequency doubler 280 may be connected to the second frequency doubler 240 to receive the third clock signal S3 from the second frequency doubler 240. Further, the third frequency doubler 280 may convert the third clock signal S3 into a fourth clock signal S4 based on a third control signal CS3 from the delay controller 260'. In this case, a frequency of the fourth clock signal S4 may be greater than that of the third clock signal S3.

Figure 20:
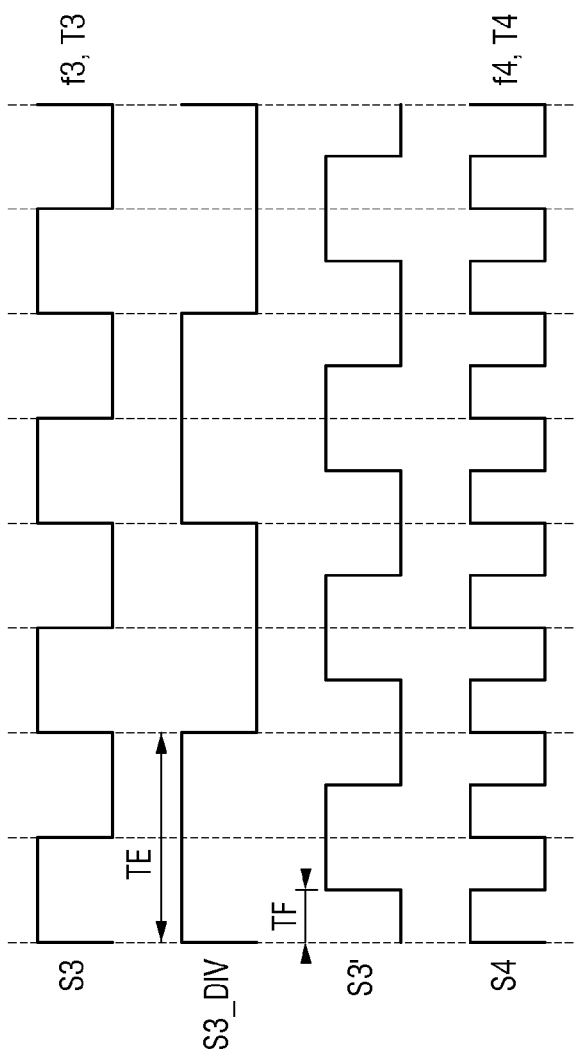
FIG. 20 is a timing diagram illustrating an operation of the third frequency doubler of FIG. 19 according to an embodiment of the disclosure.

Referring to FIGS. 19 and 20, the third frequency doubler 280 may include a third delay circuit 282 and an exclusive OR gate 283.

The third delay circuit 282 may be directly connected to the second frequency doubler 240. That is, the third delay circuit 282 may be directly connected to the exclusive OR gate 263 of the second frequency doubler 240 to receive the third clock signal S3. In this case, the third clock signal S3 may have a third frequency f3 and a third period T3. Further, in this case, the duty cycle of the third clock signal S3 may correspond to 50%. That is, the duty cycle of the third clock signal S3 may be maintained at 50% by the second frequency doubler 240. The third delay circuit 282 may delay the third clock signal S3 using the third control signal CS3 transferred from the delay controller 260' to output a third delay clock signal S3'. In this case, the third delay clock signal S3' may be more delayed than the third clock signal S3 by as much as a sixth time period TF. The delay controller 260' may generate the third control signal CS3 based on the third divided clock signal S3_DIV. In this case, the third control signal CS3 may correspond to 3 bits.

The exclusive OR gate 283 may be directly be connected to the second frequency doubler 240 and the third delay circuit 282. The exclusive OR gate 283 may receive the third clock signal S3 from the second frequency doubler 240, and may receive the third delay clock signal S3' from the third delay circuit 282. The exclusive OR gate 283 may perform an exclusive OR computation on the third clock signal S3 and the third delay clock signal S3' to generate the fourth clock signal S4. In this case, the fourth clock signal S4 may have a duty cycle of 50%, but embodiments of the present disclosure are not limited thereto. The fourth clock signal S4 has a fourth frequency f4 and a fourth period T4. The fourth frequency f4 may be twice the third frequency f3. That is, the fourth frequency f4 may be eight times that of the first frequency f1. As a result, the frequency multiplier 200' may generate a fourth clock signal S4 having a fourth frequency f4, which corresponds to eight times of the first frequency f1 of the input clock signal Sin. Therefore, occurrence of noise due to the fourth clock signal S4 may be more reduced.

Referring to FIG. 21, the third frequency doubler 280 does not receive the third control signal CS3 from the delay controller 260'. That is, the delay controller 260 or the delay controller 260' only controls the first frequency doubler 220 and the second frequency doubler 240, but does not control the third frequency doubler 280. A delay amount for the third clock signal S3 of the third delay circuit 282 need not be controlled by the delay controller 260'. At this time, the duty cycle of the third clock signal S3 may be maintained at 50%. That is, the second frequency doubler 240 may maintain the duty cycle of the third clock signal S3 at 50% under the control of the delay controller 260'. Even in this case, the fourth clock signal S4 output from the third frequency doubler 280 may have a fourth frequency f4.

Hereinafter, an electronic system 500 according to an embodiment of the disclosure will be described with reference to FIG. 22

Figure 22:
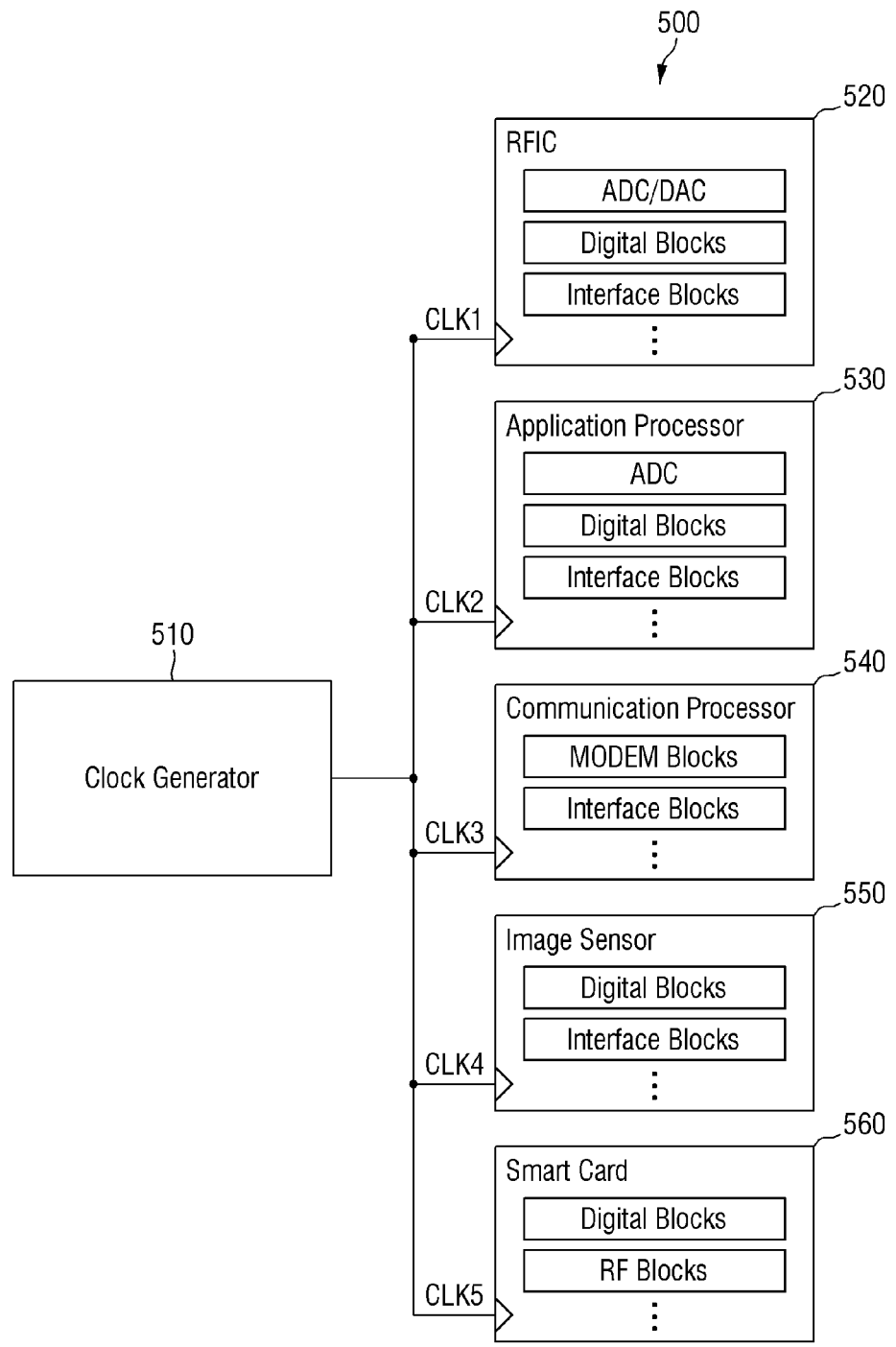
FIG. 22 is a block diagram illustrating an electronic system according to an embodiment of the disclosure.

FIG. 22 is a block diagram illustrating an electronic system according to some embodiments. For convenience of description, elements the same as that described using FIGS. 1 to 13 will briefly be described or omitted.

Referring to FIG. 22, the electronic system 500 may be a variety of electronic devices. When the electronic system 500 corresponds to a mobile device, the electronic system 500 may be a variety of electronic devices such as a mobile phone, a smart phone, a tablet personal computer (PC), a laptop computer, a Personal Digital Assistant (PDA), a Portable Multimedia Player (PMP), a digital camera, a Music Player, a Portable Game Console, and a navigation system.

The electronic system 500 may include a clock generator 510 that includes a clock generating circuit 10 implemented in accordance with the above-described embodiments, and may further include a Radio Frequency IC (RFIC) 520, an application processor (AP) 530, a communication processor 540, an image sensor 550, and a smart card 560. However, embodiments of the present disclosure are not limited thereto, and the electronic system 500 may include only a part of the above components, or may further include other additional components.

In FIG. 22, although the clock generator 510 is shown to be commonly disposed in the plurality of components described above, a clock generator according to an embodiment of the present disclosure may be separately disposed to correspond to each of the plurality of components. In accordance with some embodiments, the clock generator 510 may provide an output clock signal to one or more components, or when the clock generator 510 is time-divisionally used by the plurality of components, the clock generator may sequentially provide the output clock signal to the plurality of components.

First to fifth output clock signals CLK1 to CLK5 generated from the clock generator 510 may be provided to the RFIC 520, the AP 530, the communication processor 540, the image sensor 550, and the smart card 560, respectively. In this case, the first to fifth output clock signals CLK1 to CLK5 may correspond to the output clock signal Sout generated by the clock generating circuit 10. Further, the first to fifth output clock signals CLK1 to CLK5 may be generated based on the third clock signal S3 having a third frequency f3 generated by the frequency multiplier 200.

Each of the RFIC 520, the AP 530, the communication processor 540, the image sensor 550, and the smart card 560 may include processing blocks (or circuits) that perform signal processing using the first to fifth output clock signals CLK1 to CLK5 from the clock generator 510. For example, the processing blocks may include an analog-to-digital conversion (ADC) block, a digital-to-analog conversion (DAC) block, an interface block, a digital block, a modem block, an RF block, etc. Further, the first to fifth output clock signals CLK1 to CLK5 may be generated to be optimized for frequency and jitter properties required by each of the RFIC 520, the AP 530, the communication processor 540, the image sensor 550, and the smart card 560. For example, the first clock signal CLK1 and the second clock signal CLK2 may have the same frequency and have their respective jitter properties different from each other. In addition, at least one of the first to fifth output clock signals CLK1 to CLK5 has the same frequency depending on time, but its jitter properties may be varied.

Hereinafter, a wireless communication device 600 according to an embodiment of the disclosure will be described with reference to FIG. 23.

Figure 23:
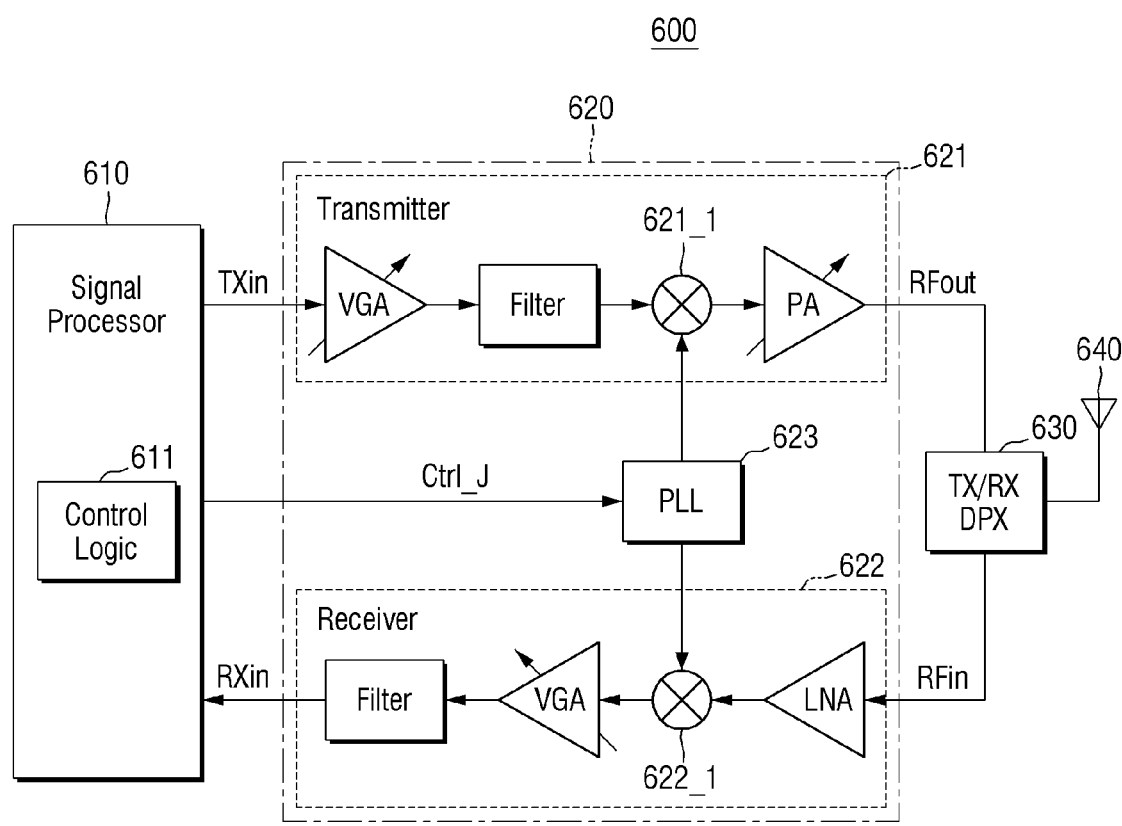
FIG. 23 is a block diagram illustrating a wireless communication device according to an embodiment of the disclosure.

FIG. 23 is a block diagram illustrating a wireless communication device according to some embodiments. For convenience of description, a portion duplicated with that described using FIGS. 1 to 13 will briefly be described or omitted.

Referring to FIG. 23, the wireless communication device 600 may include an antenna 640, and may communicate with a relative device by transmitting or receiving a signal through the antenna 640. A wireless communication system in which the wireless communication system 600 communicates with a relative device may be a wireless communication system, which uses a cellular network, such as a 5th Generation (5G) wireless system, a Long Term Evolution (LTE) system, an LTE-Advanced system, a Code Division Multiple Access (CDMA) system, and a Global System for Mobile Communications (GSM) system, as a non-limited example, or may be a Wireless Local Area Network (WLAN) system or any other wireless communication system.

In an embodiment, the wireless communication device 600 may include a signal processor 610, a transceiver 620, and a transceiving duplexer 630. The transceiving duplexer 630 may provide a signal received through the antenna 640 to the transceiver 620 as an RF input signal RFin, and may provide an RF output signal RFout received from the transceiver 620 to the antenna 640.

The signal processor 610 may process a transceiving signal of a baseband. In some embodiments, the signal processor 610 may include a control logic 611, and the control logic 611 may control the transceiver 620. For example, the control logic 611 may output a control signal Ctrl_J for controlling a clock generator 623. In this case, the clock generator 623 may include the above-mentioned clock generating circuit 10.

The transceiver 620 may include a transmitter 621 (e.g., a transmission circuit), a receiver 622 (e.g., a reception circuit), and a clock generator 623, and a PLL is exemplified as an example of the clock generator 623. The transmitter 621 may generate a radio frequency (RF) output signal RFout by processing a transmission input signal TXin received from the signal processor 610. As shown, the transmitter 621 may include a variable gain amplifier (VGA), a TX filter, a TX mixer 621_1, and a power amplifier (PA) to process the transmission input signal TXin. The receiver 622 may process the RF input signal RFin to generate a reception input signal RXin, thereby providing the signal processor 610 with the generated signal. To process the RF input signal RFin, the receiver 622 may include a low noise amplifier (LNA), an RX mixer 622_1, a variable gain amplifier (VGA), and an RX filter.

The clock generator 623 may generate an output clock signal having a frequency for sampling the transmission input signal TXin and the RF input signal RFin to provide the TX mixer 621_1 and the RX mixer 622_1 with the generated output clock signal. The clock generator 623 may include the clock generating circuit 10 according to the above-described embodiments.

Hereinafter, an application processor 700 according to an embodiment of the disclosure will be described with reference to FIG. 24.

Figure 24:
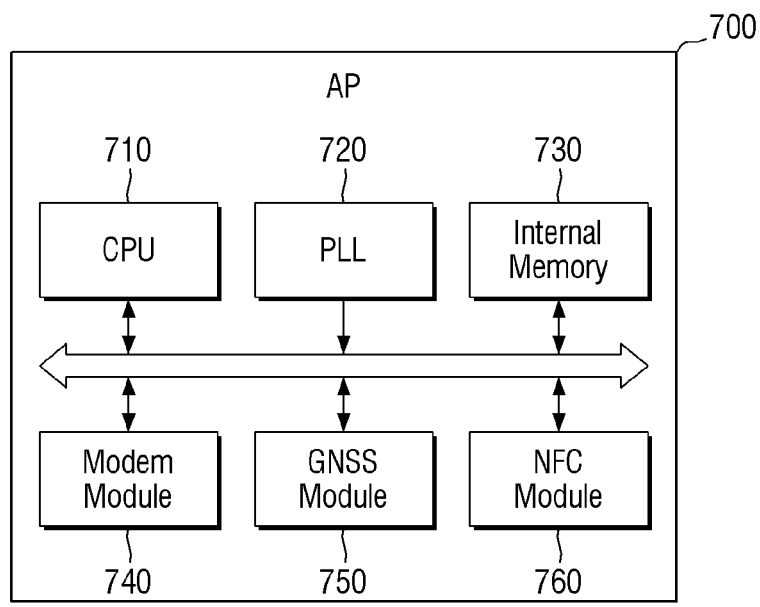
FIG. 24 is a block diagram illustrating an application processor according to an embodiment of the disclosure.

FIG. 24 is a block diagram illustrating an application processor according to an embodiment of the disclosure. For convenience of description, elements the same as that described using FIGS. 1 to 13 will be briefly described or omitted.

Referring to FIG. 24, the application processor 700 may be implemented in a system on-chip (SoC), and may include various types of circuit blocks. As an example, the application processor 700 may include a CPU 710, a PLL 720, and an internal memory 730. The application processor 700 may further include a modem module 740, a global navigation satellite system (GNSS) module 750, and a Near Field Communication (NFC) module 760 as an example of a module for performing a different type of communication. In addition to the components shown in FIG. 24, the application processor 700 may further include various types of communication modules including WLAN, Bluetooth (BT), and the like.

The CPU 710 may control a function of the application processor 700 by executing various programs. In addition, various programs for controlling the operation of the application processor 700 may be stored in the internal memory 730, and may be executed by various types of processors such as the CPU 710, a processor in the modem module 740, and a processor provided in the GNSS module 750.

The PLL 720 may correspond to the clock generating circuit 10 according to the above-described embodiments. The PLL 720 may provide an output clock signal to the modem module 740, the GNSS module 750, and the NFC module 760. Although FIG. 24 shows that one PLL 720 is provided in the application processor 700, a plurality of PLLs may be provided in the application processor 700.

In concluding the detailed description, those skilled in the art will appreciate that many variations and modifications may be made to these embodiments without substantially departing from the principles of the present disclosure. Therefore, the disclosed embodiments of the invention are used in a generic and descriptive sense only and not for purposes of limitation.

What is claimed is:

1. A clock generating circuit comprising:
   a first frequency multiplier configured to generate a second clock signal having a second frequency based on a first clock signal having a first frequency; and
   a second frequency multiplier configured to generate a third clock signal having a third frequency based on the second clock signal,
   wherein the first frequency multiplier comprises:
   a pulse width control circuit configured to control a duty cycle of the first clock signal;
   a first delay circuit configured to receive the first clock signal of which the duty cycle has been controlled, and delay the received first clock signal based on a duty cycle of the second clock signal to output a first delay clock signal; and
   a first exclusive OR gate configured to perform an exclusive OR computation on the first clock signal of which the duty cycle has been controlled and the first delay clock signal to output the second clock signal,
   wherein the second frequency is greater than the first frequency, and the third frequency is greater than the second frequency,
   wherein the first delay circuit receives a control signal based on a comparison signal output by the second frequency multiplier, the comparison signal including information on the duty cycle of the second clock signal.

2. The clock generating circuit of claim 1, wherein the second frequency multiplier comprises:
   a second delay circuit configured to receive the second clock signal, and delay the second clock signal to output a second delay clock signal;
   a second exclusive OR gate configured to perform an exclusive OR computation on the second clock signal and the second delay clock signal to output the third clock signal; and
   a monitoring circuit configured to receive the third clock signal to monitor the duty cycle of the second clock signal.

3. The clock generating circuit of claim 2, wherein the first delay circuit comprise:
   a digital delay circuit configured to determine a delay amount of the first delay clock signal based on the duty cycle of the second clock signal from the monitoring circuit; and
   an analog delay circuit configured to determine the delay amount of the first delay clock signal.

4. The clock generating circuit of claim 3, wherein the duty cycle of the second clock signal is maintained at 50%.

5. The clock generating circuit of claim 3, wherein the second delay circuit delays the received second clock signal based on the duty cycle of the second clock signal from the monitoring circuit to output the second delay clock signal.

6. The clock generating circuit of claim 5, wherein a duty cycle of the third clock signal is maintained at 50%.

7. The clock generating circuit of claim 1, further comprising a third frequency multiplier configured to generate a fourth clock signal having a fourth frequency greater than the first to third frequencies, based on the third clock signal, wherein a duty cycle of the third clock signal output from the second frequency multiplier is maintained at 50%.

8. The clock generating circuit of claim 7, wherein the third frequency multiplier receives the third clock signal, and delays the received third clock signal based on the duty cycle of the second clock signal to output the fourth clock signal.

9. The clock generating circuit of claim 1, wherein the first frequency multiplier comprises a monitoring circuit configured to receive the second clock signal from the first exclusive OR gate to monitor the duty cycle of the first clock signal, and
the pulse width control circuit comprises:
a digital control circuit configured to control the duty cycle of the first clock signal based on the duty cycle of the first clock signal from the monitoring circuit; and
an analog control circuit configured to control the delay amount of the first clock signal of which the duty cycle has been controlled.

10. The clock generating circuit of claim 1, wherein the pulse width control circuit and the first delay circuit operate by using the first clock signal having the first frequency, and the second frequency multiplier operates by using the second clock signal having the second frequency.

11. The clock generating circuit of claim 1, wherein the second frequency is twice the first frequency, and the third frequency is twice the second frequency.

12. A clock generating circuit comprising:
a pulse width control circuit configured to control a duty cycle of an input clock signal having a first frequency to output a first clock signal;
a first delay circuit configured to delay the first clock signal based on information to output a first delay clock signal;
a first exclusive OR gate configured to perform an exclusive OR computation on the first clock signal and the first delay clock signal to output a second clock signal having a second frequency;
a second delay circuit connected with the first exclusive OR gate, and configured to delay the second clock signal to output a second delay clock signal;
a second exclusive OR gate configured to perform an exclusive OR computation on the second clock signal and the second delay clock signal to output a third clock signal having a third frequency; and
a monitoring circuit monitoring the third clock signal to provide the information on a duty cycle of the second clock signal,
wherein the second frequency is greater than the first frequency, and the third frequency is greater than the second frequency.

13. The clock generating circuit of claim 12, wherein the first delay circuit delays the first clock signal based on the duty cycle of the second clock signal, and the second clock signal output from the first exclusive OR gate has a duty cycle of 50%.

14. The clock generating circuit of claim 13, wherein the second delay circuit delays the second clock signal based on the duty cycle of the second clock signal.

15. The clock generating circuit of claim 12, wherein the pulse width control circuit controls a duty cycle of the input clock signal to output a first clock signal having a duty cycle of 50%.

16. The clock generating circuit of claim 12, wherein the pulse width control circuit and the first delay circuit operate by using the first clock signal having the first frequency, and the second delay circuit operates by using the second clock signal having the second frequency.

17. The clock generating circuit of claim 12, further comprising:
a third delay circuit connected with the second exclusive OR gate, and configured to delay the third clock signal to output a third delay clock signal; and
a third exclusive OR gate connected with second exclusive OR gate, and configured to perform an exclusive OR computation using the third clock signal and the third delay clock signal to output a fourth clock signal having a fourth frequency,
wherein the fourth frequency is greater than the first to third frequencies.

18. A clock generating circuit comprising:
a first frequency multiplier configured to receive a first clock signal having a first frequency and delay the first clock signal to output a second clock signal having a second frequency;
a second frequency multiplier configured to receive the second clock signal and output a third clock signal having a third frequency; and
a delay control circuit configured to determine a delay amount for the first clock signal of the first frequency multiplier based on a duty cycle of the second clock signal to allow the duty cycle of the second clock signal to reach 50%,
wherein the second frequency is greater than the first frequency, and the third frequency is greater than the second frequency,
wherein the second frequency multiplier monitors the third clock signal to provide information on the duty cycle of the second clock signal to the delay control circuit.

19. The clock generating circuit of claim 18, wherein the second frequency multiplier delays the second clock signal to output the third clock signal.

* * * * *